US012642149B2

(12) United States Patent
Liu

(10) Patent No.: US 12,642,149 B2
(45) Date of Patent: May 26, 2026

(54) PACKAGE FORMATION USING UBM-FIRST APPROACH AND THE CORRESPONDING PACKAGES

(71) Applicant: Taiwan Semiconductor Manufacturing Co., Ltd., Hsinchu (TW)

(72) Inventor: Tzuan-Horng Liu, Longtan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 651 days.

(21) Appl. No.: 18/151,071

(22) Filed: Jan. 6, 2023

(65) Prior Publication Data

US 2024/0234273 A1 Jul. 11, 2024

(51) Int. Cl.
| | |
|---|---|
| *H10W 90/00* | (2026.01) |
| *H10W 70/05* | (2026.01) |
| *H10W 70/60* | (2026.01) |
| *H10W 70/685* | (2026.01) |
| *H10W 74/10* | (2026.01) |
| *H10W 72/00* | (2026.01) |
| *H10W 74/15* | (2026.01) |

(52) U.S. Cl.
CPC ......... *H10W 90/701* (2026.01); *H10W 70/05* (2026.01); *H10W 70/611* (2026.01); *H10W 70/685* (2026.01); *H10W 74/117* (2026.01); *H10W 90/00* (2026.01); *H10W 72/072* (2026.01); *H10W 72/07236* (2026.01); *H10W 72/073* (2026.01); *H10W 72/07337* (2026.01); *H10W 74/15* (2026.01); *H10W 90/724* (2026.01); *H10W 90/734* (2026.01)

(58) Field of Classification Search
CPC ......... H01L 24/09; H01L 24/19; H01L 24/20; H01L 25/0652; H01L 25/50; H01L 21/56
See application file for complete search history.

(56) References Cited

U.S. PATENT DOCUMENTS

| | | | |
|---|---|---|---|
| 11,031,256 | B2 | 6/2021 | Huemoeller et al. |
| 2007/0001301 | A1* | 1/2007 | Wang ...................... H01L 24/05 |
| | | | 257/734 |
| 2018/0269188 | A1* | 9/2018 | Yu ........................ H01L 23/3128 |
| 2021/0090983 | A1* | 3/2021 | Lin ....................... H01L 25/50 |
| 2021/0159182 | A1* | 5/2021 | Jeng ...................... H01L 23/31 |
| 2023/0014913 | A1 | 1/2023 | Chen et al. |

FOREIGN PATENT DOCUMENTS

| | | |
|---|---|---|
| CN | 115295507 A | 11/2022 |
| TW | 202230538 A | 8/2022 |

* cited by examiner

*Primary Examiner* — Trang Q Tran
(74) *Attorney, Agent, or Firm* — Slater Matsil, LLP

(57) ABSTRACT

A method includes forming a reconstructed wafer including forming an Under-Bump Metallurgy (UBM) over a first carrier, forming a first interconnect structure including a plurality of redistribution lines over and electrically connecting to the UBM, bonding a first die over the first interconnect structure, encapsulating the first die in a first encapsulant, forming a second interconnect structure over the first die, and bonding a second die over the second interconnect structure. The method further includes de-bonding the reconstructed wafer from the first carrier, forming an electrical connector physically contacting the UBM, sawing the reconstructed wafer to form a plurality of packages, and bonding one of the plurality of packages to a package component.

20 Claims, 37 Drawing Sheets

PACKAGE FORMATION USING UBM-FIRST APPROACH AND THE CORRESPONDING PACKAGES

BACKGROUND

Integrated circuits are having increasingly more functions. In order to integrate more functions together, a plurality of device dies are manufactured, and are packaged together in a packaging process(es). The plurality of device dies are electrically interconnected so that they may work together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
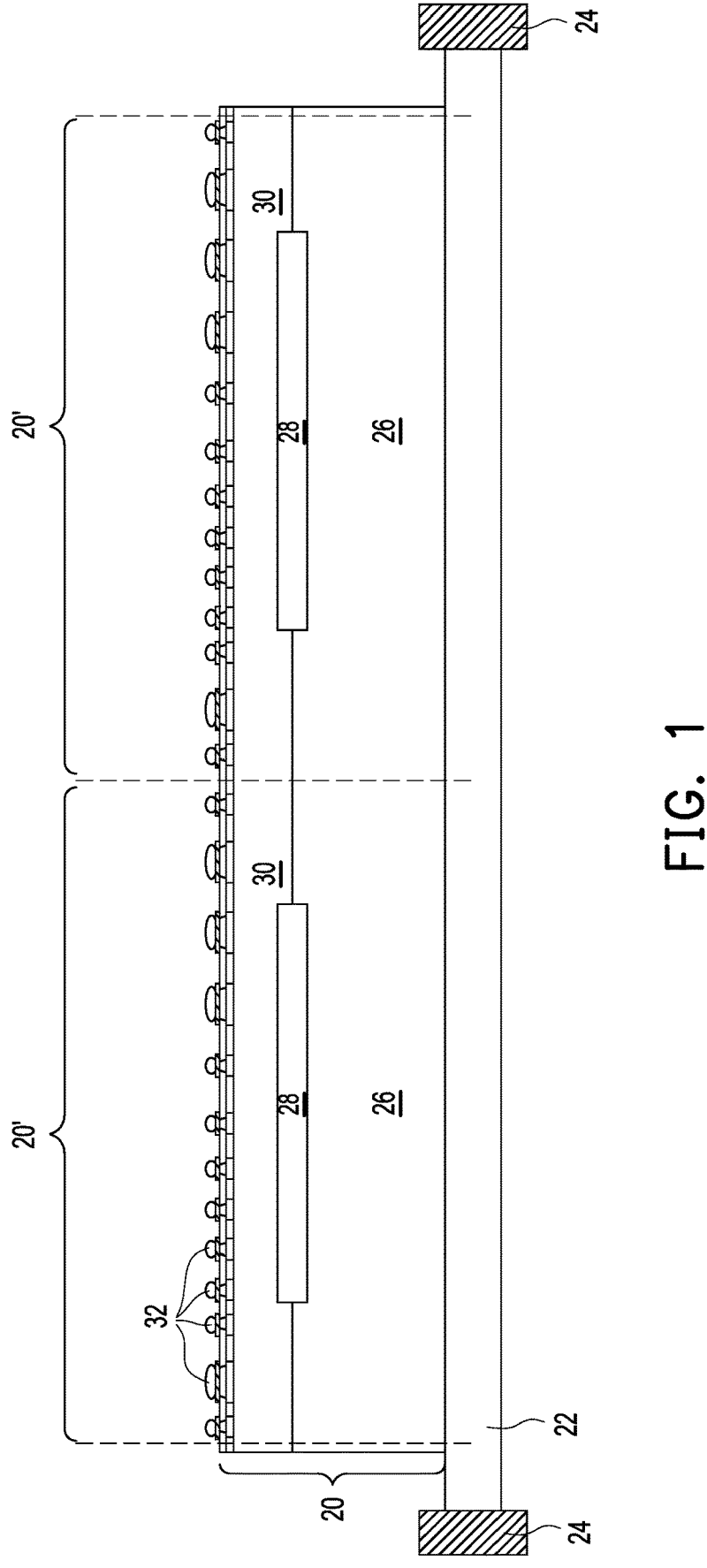
FIGS. 1 through 19 illustrate the intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments, Under-Bump Metallurgies (UBMs) are formed in a UBM-first process. Also, device dies are bonded through a face-to-back bonding process. Accordingly, the formation of the package may be performed using a single carrier, and manufacturing cost is saved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 42:
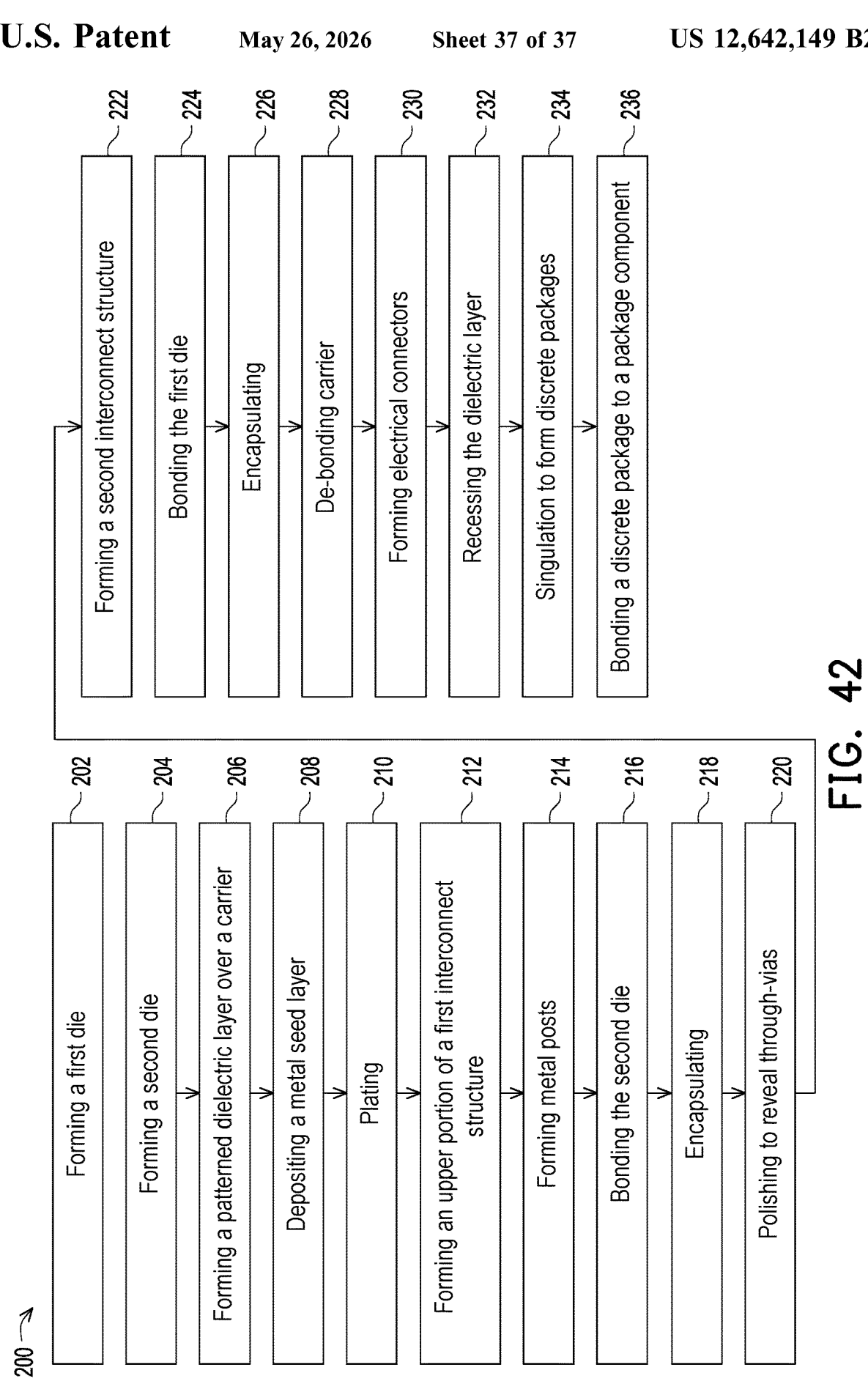
FIG. 42 illustrates a process flow for forming a package in accordance with some embodiments.

FIGS. 1 through 19 illustrate the cross-sectional views of intermediate stages in the formation of a package in accordance with some embodiments. The corresponding processes are also reflected schematically in the process flow 200 as shown in FIG. 42.

Referring to FIG. 1, device wafer 20 is formed, and is placed on tape 22, which is attached to frame 24. The respective process is illustrated as process 202 in the process flow 200 as shown in FIG. 42. In accordance with some embodiments, device wafer 20 includes substrate 26. Substrate 26 may be a semiconductor substrate such as a silicon substrate. In accordance with other embodiments, substrate 26 may include other semiconductor materials such as silicon germanium, carbon-doped silicon, or the like. Substrate 26 may be a bulk substrate, or may have a layered structure, for example, including a silicon substrate and a silicon germanium layer over the silicon substrate.

In accordance with some embodiments, device wafer 20 includes device dies 20', which may include logic dies, memory dies, input-output dies, Integrated Passive Devices (IPDs), or the like, or combinations thereof. Device dies 20' may include system-on-chip dies, each including a plurality of circuits 28 interconnected to form a system. For example, the system-on-chip dies may include central processing units (CPU), memories, input/output circuits, and/or secondary storage circuits. Device dies 20' may also include Graphic Processing Unit (GPU) dies, mobile application dies, Micro Control Unit (MCU) dies, BaseBand (BB) dies, Application processor (AP) dies, or the like. The memory circuits in device wafer 20 may include Static Random-Access Memories (SRAMs), Dynamic Random-Access Memories (DRAMs), or the like.

In accordance with some embodiments, integrated circuit devices 28 are formed on the top surface of semiconductor substrate 26. Example integrated circuit devices 28 may include transistors, capacitors, diodes, and/or the like. The details of integrated circuit devices 28 are not illustrated herein. Interconnect structure 30 are formed over and interconnected to integrated circuit devices 28. Interconnect structure 30 may include Inter-Layer Dielectric (ILD), and contact plugs in the ILD and connected to integrated circuit devices 28.

Interconnect structure 30 further includes metal lines and vias (not shown), which are formed in dielectric layers (not shown). The dielectric layers may include Inter-Metal Dielectric (IMD) layers. In accordance with some embodiments, some of the dielectric layers are formed of low-k dielectric materials having dielectric constant values (k-values) lower than about 3.0. The metal lines at a same level are collectively referred to as a metal layer hereinafter. In accordance with some embodiments, interconnect structure 30 includes a plurality of metal layers that are interconnected through the vias. The metal lines and vias may be formed of copper or copper alloys, and they can also be formed of other metals, and may be formed through single damascene processes and dual damascene processes.

Electrical connectors 32 are formed at the top surface of device dies 20', and are electrically connected to integrated circuit devices 28 through interconnect structure 30. Electrical connectors 32 may include metal pads, metal pillars, solder regions, and/or the like.

Throughout the description, the side of substrate 26 having integrated circuit devices 28 is referred to as the front (face) side of substrate 26. Accordingly, the illustrated top side of substrate 26 and wafer 20 is referred to as the front side of substrate 26 and wafer 20. The side (the illustrated bottom side) of substrate 26 and wafer 20 opposite to the front side is referred to as the backside. Further referring to FIG. 1, a singulation process is performed to saw wafer 20, so that device dies 20' are separated from each other.

Figure 2:
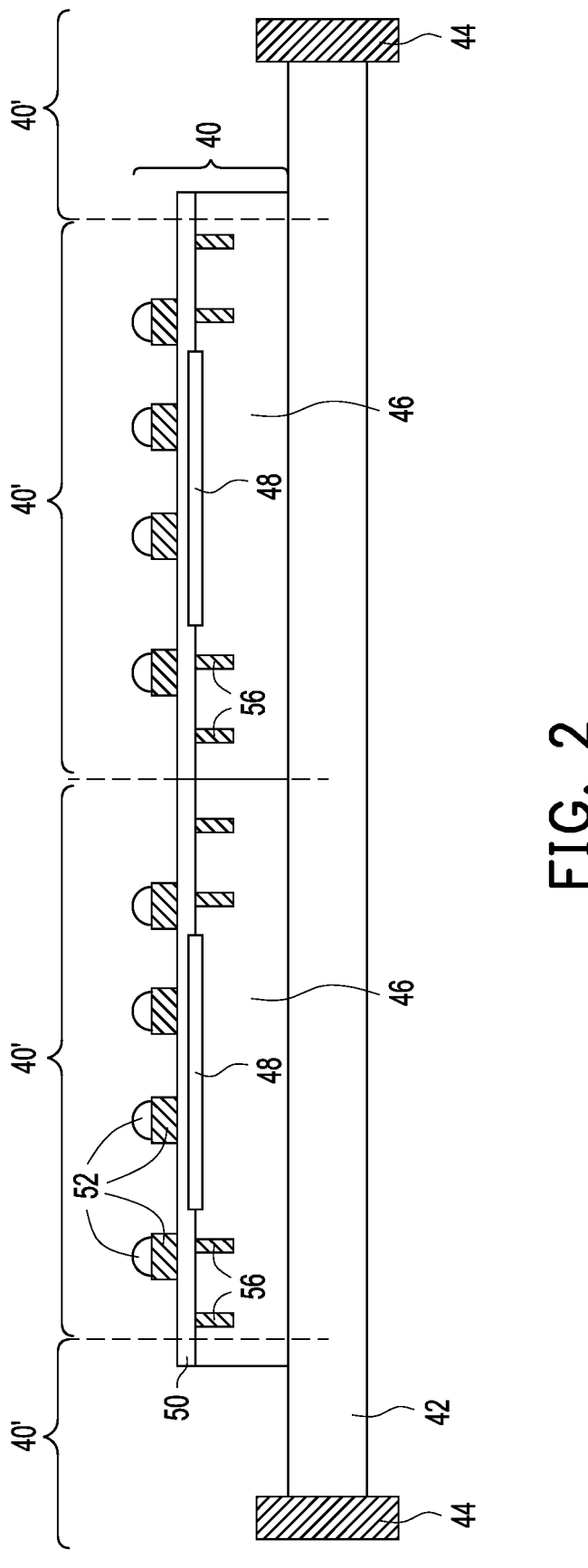

Referring to FIG. 2, device wafer 40 is formed, and is placed on tape 42, which is attached to frame 44. The respective process is illustrated as process 204 in the process flow 200 as shown in FIG. 42. Device wafer 40 includes device dies 40' therein. In accordance with some embodiments, device wafer 40 includes substrate 46. Substrate 46 may be a semiconductor substrate such as a silicon substrate.

In accordance with some embodiments, device dies 40' include active devices. For example, integrated circuit devices 48 are formed on the top surface of semiconductor substrate 46. Example integrated circuit devices 48 may include transistors, capacitors, diodes, and/or the like. Device dies 40' may include logic circuits, memory circuits, input-output circuits, or the like, or combinations thereof. In accordance with alternative embodiments, device dies 40' include passive devices such as capacitors, inductors, resistors, and/or the like, and are free from active devices therein. In accordance with yet alternative embodiments, device dies 40' are free from both of active devices and passive devices. Interconnect structure 50 is formed over integrated circuit devices 48, and may include an ILD, contact plugs, metal lines, vias, and/or the like.

Through-vias 56 (sometimes referred to as through-silicon vias (TSVs) or through-semiconductor vias (also TSVs)) are formed in device dies 40', and extend from the front side (the illustrated top side) into substrate 46. Accordingly, device dies 40' are alternatively referred to as TSV dies 40' hereinafter. Through-vias 56 are encircled by dielectric insulation layers (not shown), which electrically insulate through-substrate vias 56 from substrate 46.

Throughout the description, the side of substrate 46 having integrated circuit devices 48 formed is referred to as the front (face) side of substrate 46. Accordingly, the illustrated top side of substrate 46 and wafer 40 is referred to as the front side of substrate 46 and wafer 40. The side (the illustrated bottom side) of substrate 46 and wafer 40 opposite to the front side is referred to as the backside.

In accordance with some embodiments, wafer 20 and device dies 20' (FIG. 1) are formed using an advanced technology, while wafer 40 and device dies 40' are formed using an older technology. For example, wafer 20 and device dies 20' may be formed using a 5-nm technology, 3-nm technology, or 2-nm technology, while wafer 40 and device dies 40' may be formed using 5-nm technology, 7-nm technology, 14-nm technology, 28-nm technology, or older.

Figures 3, 4:
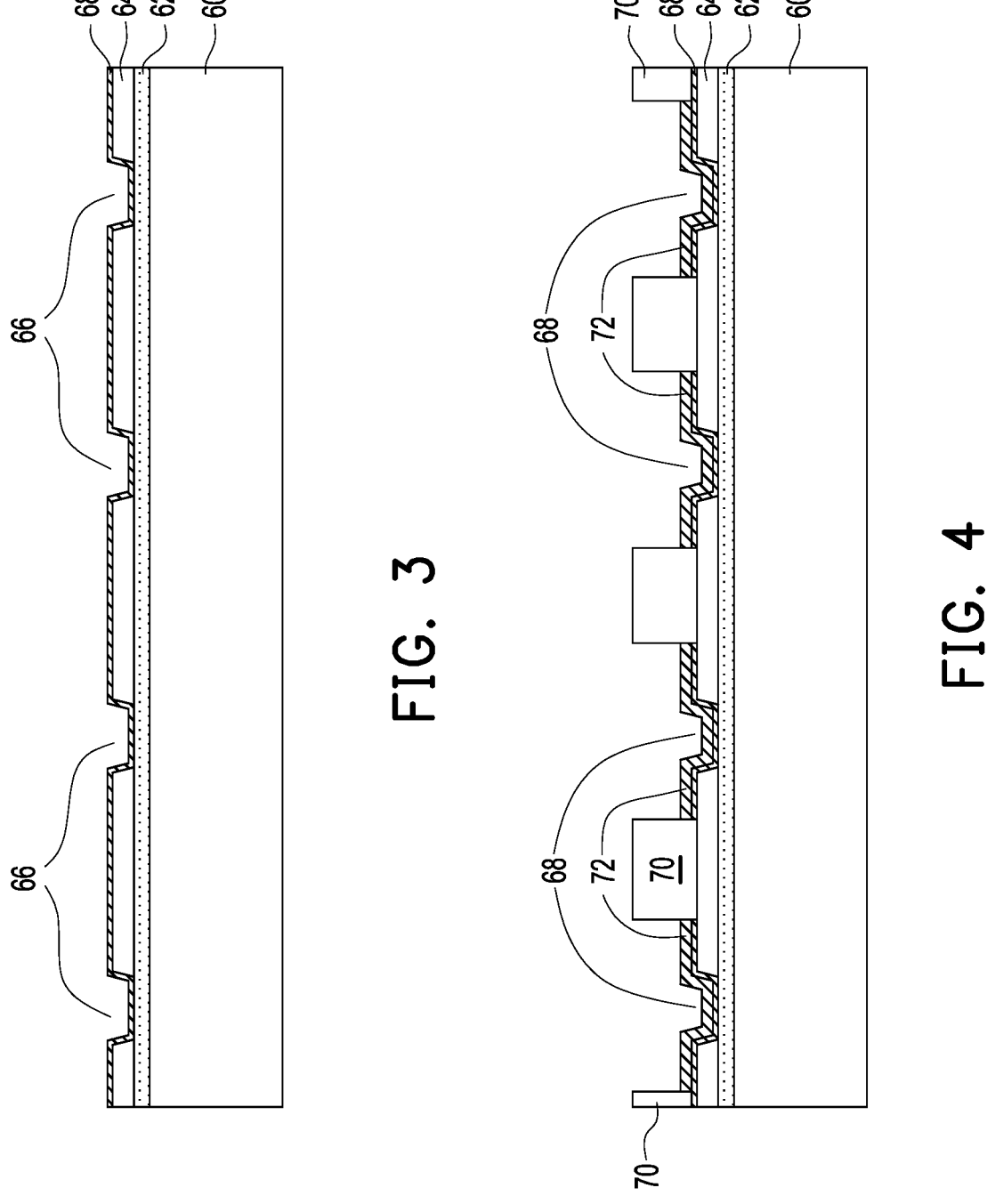

Referring to FIG. 3, release film 62 is formed on carrier 60. Carrier 60 may be a glass carrier, a silicon wafer, an organic carrier, or the like. Carrier 60 may have a round top-view shape in accordance with some embodiments. Release film 62 may be formed of a polymer-based material (such as a Light-To-Heat-Conversion (LTHC) material), which is capable of being decomposed under radiation such as a laser beam, so that carrier 60 may be de-bonded from the overlying structures that will be formed in subsequent processes.

Dielectric layer 64 is formed on release film 62. The respective process is illustrated as process 206 in the process flow 200 as shown in FIG. 42. In accordance with some embodiments, dielectric layer 64 is formed of a polymer, which may also be a photo-sensitive material such as polybenzoxazole (PBO), polyimide, benzocyclobutene (BCB), or the like, that may be patterned using a photolithography process. Dielectric layer 64 is patterned to form openings 66. The formation may include performing a light-exposure process followed by a development process on dielectric layer 64.

Next, metal seed layer 68 is deposited. The respective process is illustrated as process 208 in the process flow 200 as shown in FIG. 42. In accordance with some embodiments, metal seed layer 68 is formed through Physical Vapor Deposition (PVD) or a like process. Metal seed layer 68 may include a titanium layer for improving adhesion, and a copper layer over the titanium layer. Metal seed layer 68 includes some portions extending into openings 66, and some other portions over dielectric layer 64.

Referring to FIG. 4, plating mask 70 is formed on metal seed layer 68. Plating mask 70 may include a photoresist, and may be patterned, for example, through a light-exposure process followed by a development process. Metal seed layer 68 are thus exposed through plating mask 70. Next, a plating process is performed to plate conductive material 72 on metal seed layer 68. The respective process is illustrated as process 210 in the process flow 200 as shown in FIG. 42. The plating may be performed using, for example, an electrochemical plating process, an electro-less plating process, or the like. In accordance with some embodiments, conductive material 72 comprises a nickel layer and a copper layer over the nickel layer. In accordance with alternative embodiments, conductive material 72 comprises a copper layer without the nickel layer.

In a subsequent process, plating mask 70 is removed, thus exposing the underlying portions of metal seed layer 68. The exposed portions of metal seed layer 68 are then removed in an etching process, wherein the plated conductive material 72 is used as an etching mask. The remaining portions of metal seed layer 68 and conductive material 72 are collectively referred to as Under-Bump-Metallurgies (UBMs) 74 hereinafter, as shown in FIG. 5.

Figures 5, 6:
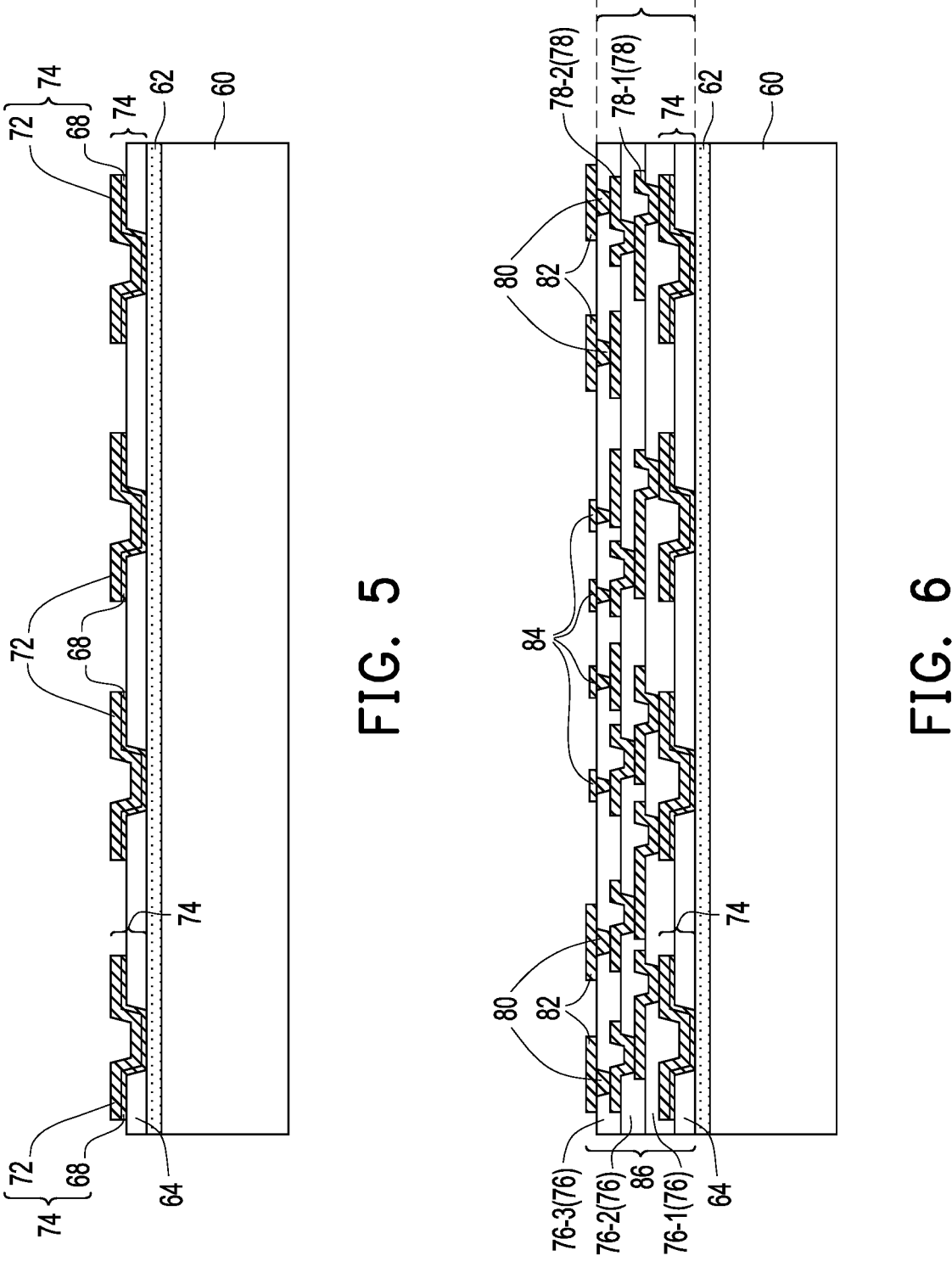

Referring to FIG. 6, a plurality of dielectric layers 76 (including dielectric layers 76-1, 76-2, and 76-3) and a plurality of Redistribution Lines (RDLs) 78 (including RDLs 78-1 and 78-2) are formed. The respective process is illustrated as process 212 in the process flow 200 as shown in FIG. 42. In subsequent description, the formation of dielectric layer 76-1 and RDLs 78-1 are described as an example, and the overlying dielectric layers and RDLs may be formed using essentially the same processes as the formation of dielectric layer 76-1 and RDLs 78-1.

Dielectric layer 76-1 is formed on UBMs 74 and dielectric layer 64. The bottom surface of dielectric layer 76-1 is in contact with the top surfaces of UBMs 74 and dielectric layer 64. In accordance with some embodiments, dielectric layer 76-1 is formed of a polymer, which may be a photosensitive material such as PBO, polyimide, BCB, or the like. Alternatively, dielectric layer 76-1 may include a non-organic dielectric material such as silicon oxide, silicon nitride, silicon carbide, silicon oxynitride, or the like. Dielectric layer 76-1 is then patterned to form openings therein. Hence, some portions of UBMs 74 are exposed through the openings in dielectric layer 76-1.

Next, RDLs 78-1 are formed to connect to UBMs 74. RDLs 78-1 include metal traces (metal lines) over dielectric layer 76-1, and vias extending into the openings in dielectric layer 76-1. RDLs 78-1 may also be formed through a plating process, wherein each of RDLs 78-1 includes a metal seed layer (not shown) and a plated metallic material over the metal seed layer. In accordance with some embodiments, the formation of RDLs 78-1 may include patterning dielectric layer 76-1 to form via openings, depositing a blanket metal seed layer extending into the via openings, and forming and patterning a plating mask (such as a photoresist), with openings formed directly over the via openings. A plating process is then performed to plate a metallic material, which fills the via openings, and has some portions higher than the top surface of dielectric layer 76-1. The plating mask is then removed, followed by an etching process to remove the exposed portions of the metal seed layer, which was previously covered by the plating mask. The remaining portions of the metal seed layer and the plated metallic material are RDLs 78-1.

The metal seed layer and the plated material may be formed of the same material or different materials. The metal seed layer may be formed of copper, or may include a nickel layer and a copper layer over the copper layer. The metallic material in RDLs 78-1 may include a metal or a metal alloy including copper, aluminum, tungsten, or alloys thereof. RDLs 78-1 include RDL lines (also referred to as traces or trace portions) over dielectric layer 76-1, and via portions in dielectric layer 76-1. Since the trace portions and the via portions are formed in a same plating process, there is no distinguishable interface between the via portions and the corresponding overlying the trace portions. Also, each of the via portions may have a tapered profile, with the upper portions being wider than the corresponding lower portions.

In subsequent processes, more dielectric layers 76 and RDLs 78 are formed. It is appreciated that although in the illustrated example embodiments, three dielectric layers 76-1, 76-2, and 76-3 and two RDLs 78-1 and 78-2 are shown as an example, fewer or more dielectric layers and RDL layers may be adopted, depending on the routing requirement.

Further referring to FIG. 6, vias 80 and metal pads 82 are formed. Bond pads 84 are also formed. Throughout the description, the structures over release film 62 are collectively referred to as interconnect structure 86.

Figures 7, 8:
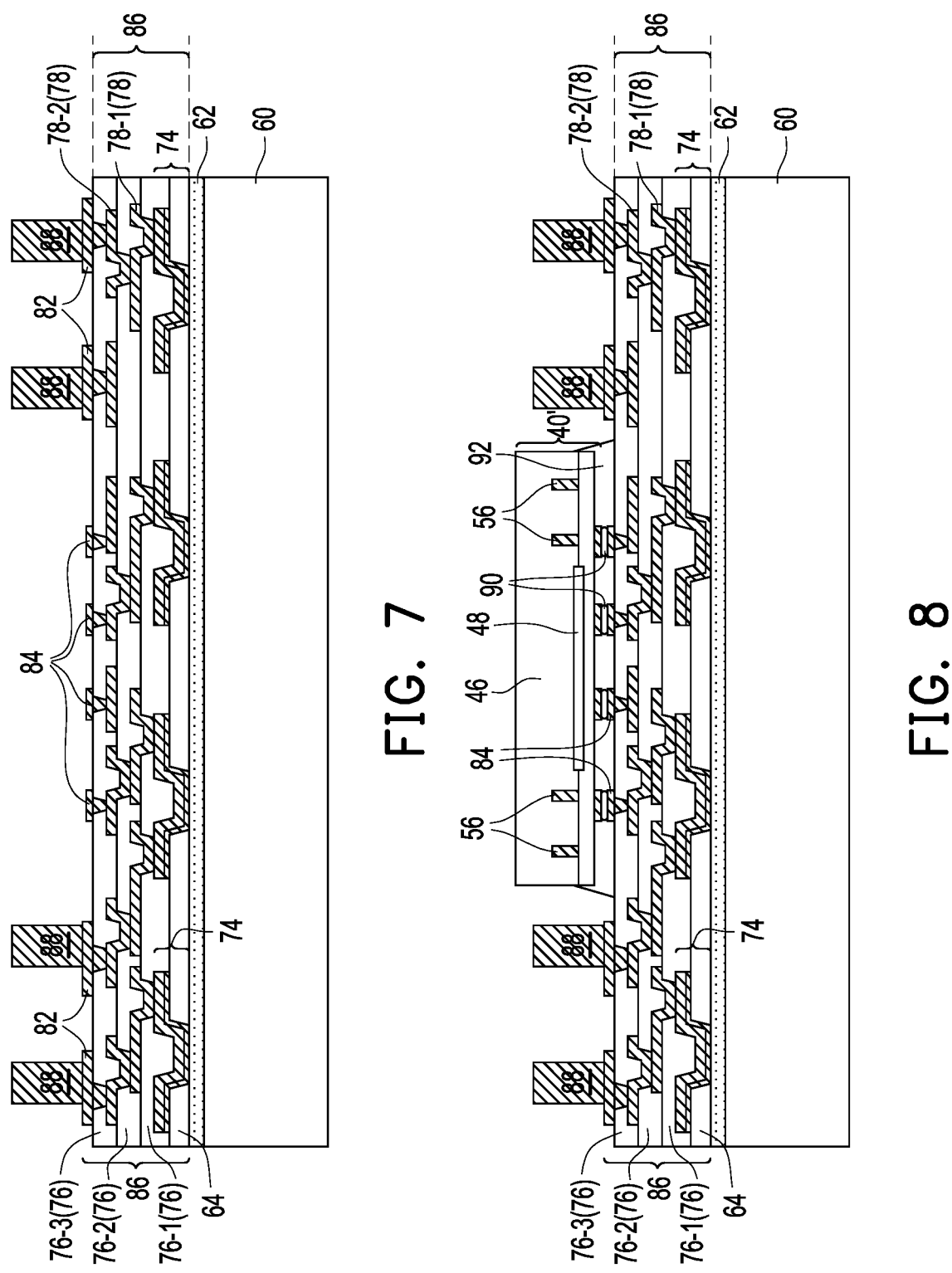

Referring to FIG. 7, after the formation of interconnect structure 86, metal posts 88 are formed. The respective process is illustrated as process 214 in the process flow 200 as shown in FIG. 42. The formation of metal posts 88 may include depositing a metal seed layer over metal pads 82, and forming a patterned plating mask, through which some portions of the metal seed layer are exposed. A plating process is then performed to plate a metallic material into the openings in the plating mask. The plating mask is then removed, followed by the etching of the exposed portions of the metal seed layer to form metal posts 88. The formation of metal posts 88 may also share the same metal seed layer that is used for forming metal pads 82 and bond pads 84.

FIG. 8 illustrates the bonding of TSV die 40' to bond pads 84. The respective process is illustrated as process 216 in the process flow 200 as shown in FIG. 42. Although one TSV die 40' is shown, a plurality of TSV dies 40' are bonded in the same bonding process. The bonding process may include solder bonding, metal-to-metal direct bonding, or the like. For example, the bonding may be performed through solder regions 90. After the bonding, underfill 92 is dispensed into the gap between TSV die 40' and the underlying interconnect structure 86. In accordance with some embodiments, underfill 92 may include a base material, which may include a polymer, a resin, an epoxy, and/or the like, and filler particles in the base material. The filler particles may be dielectric particles of silica, alumina, boron nitride, or the like, and may have spherical shapes. A thinning process may be performed to thin substrate 46 in TSV die 40'. The thinning process may reduce the aspect ratio of the gaps between neighboring TSV dies 40' and metal posts 88.

Figure 9:
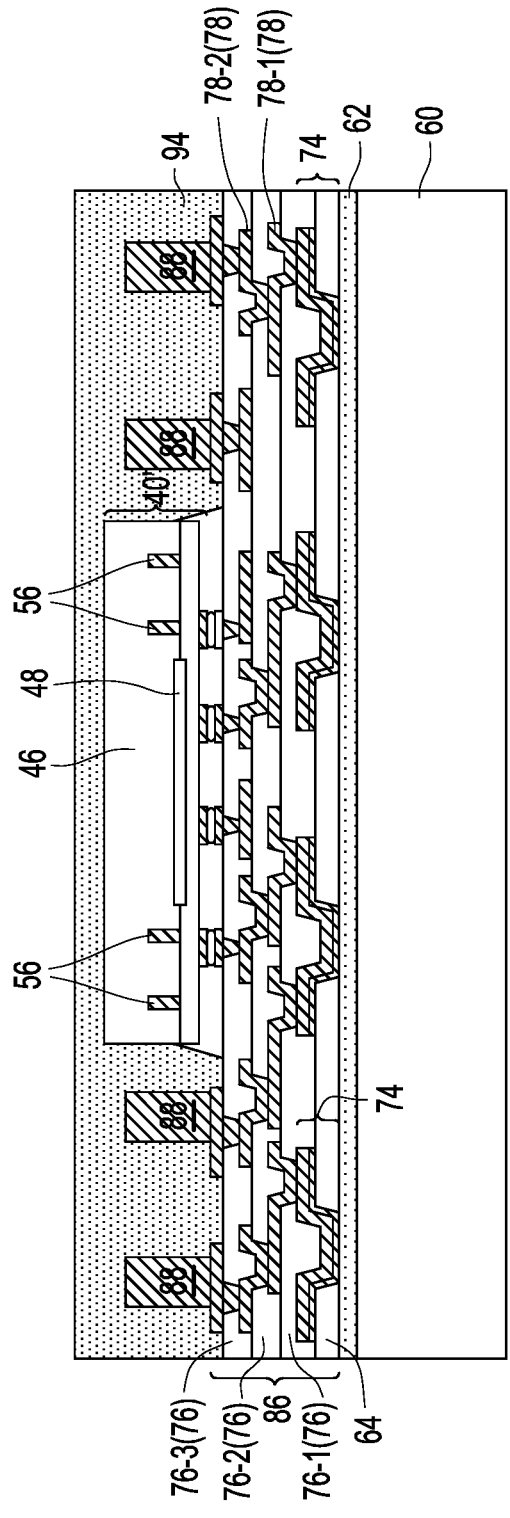

Next, as shown in FIG. 9, encapsulant 94 is dispensed to encapsulate TSV die 40' and metal posts 88 therein. The respective process is illustrated as process 218 in the process flow 200 as shown in FIG. 42. Encapsulant 94 may include a molding compound, a molding underfill, an epoxy, and/or a resin. When the encapsulation is finished, the top surface of encapsulant 94 is higher than the top ends of metal posts 88 and the top surfaces of TSV die 40'. Encapsulant 94 may include a base material, which may be a polymer, a resin, an epoxy, or the like, and filler particles in the base material. The filler particles may be dielectric particles of silica, alumina, boron nitride, or the like, and may have spherical shapes.

Figure 10:
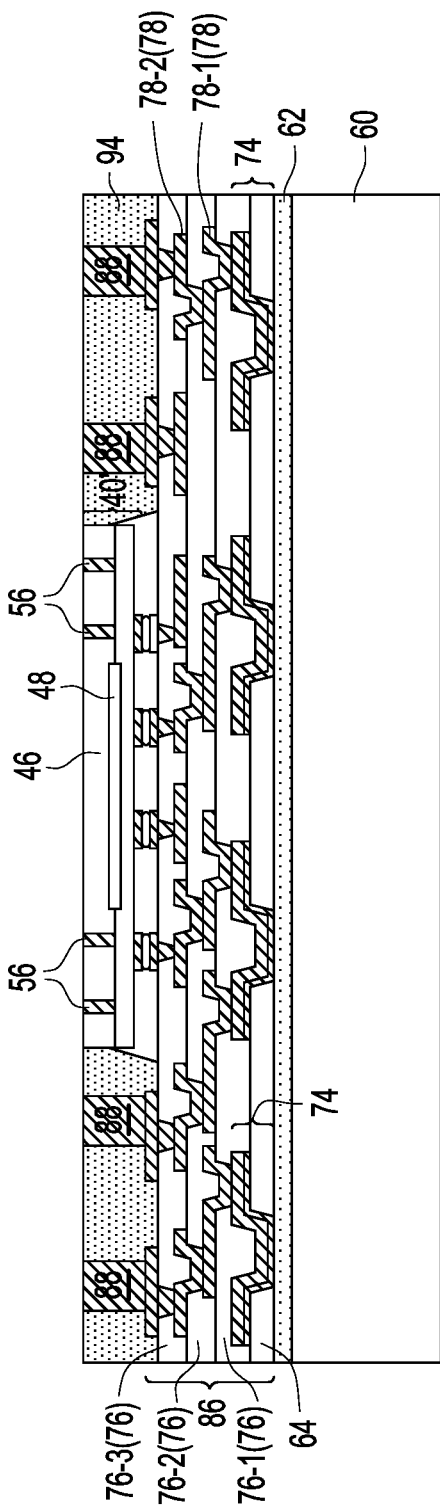

Referring to FIG. 10, a planarization process such as a Chemical Mechanical Polish (CMP) process or a mechanical grinding process is performed to thin encapsulant 94 and TSV die 40', until metal posts 88 and through-vias 56 in TSV die 40' are revealed. The respective process is illustrated as process 220 in the process flow 200 as shown in FIG. 42. Metal posts 88 are alternatively referred to as through-vias 88 hereinafter since they penetrate through encapsulant 94.

Figure 11:
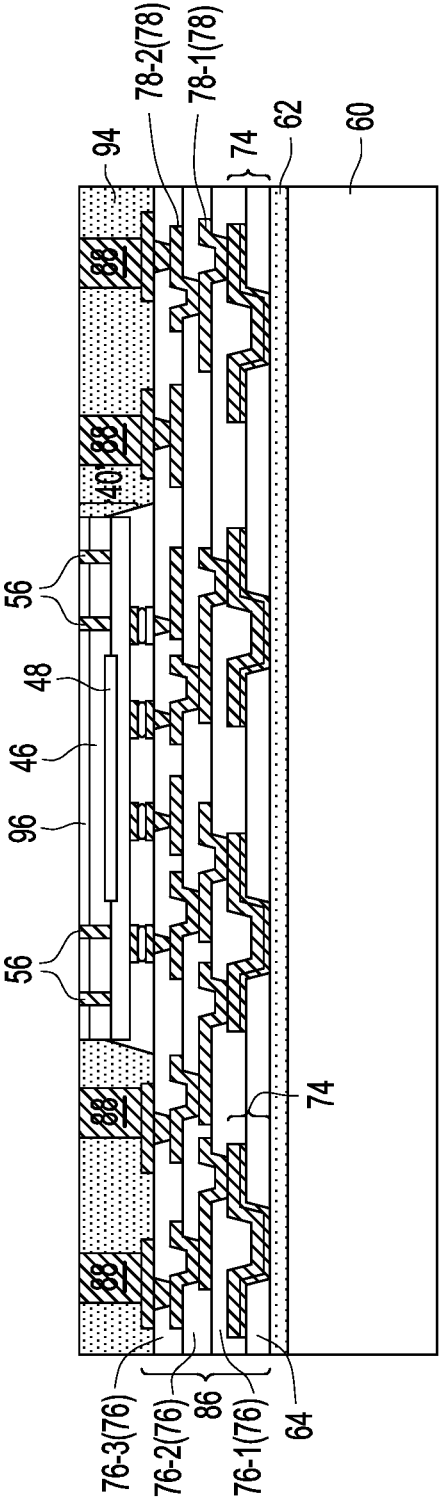

Next, as shown in FIG. 11, dielectric isolation layer 96 is formed as a top portion of TSV die 40'. In accordance with some embodiments, substrate 46 is first recessed, so that the top portions of through-vias 56 protrude higher than the illustrated top surface of substrate 46. Dielectric isolation layer 96 is then formed by dispensing or depositing a dielectric material, which may be formed of or comprise a polymer (such as polyimide), silicon oxide, silicon nitride, or the like. A planarization process is then performed to remove the excess portions of the dielectric material over through-vias 56, so that through-vias 56 are revealed. The remaining dielectric material forms dielectric isolation layer 96.

Figure 12:
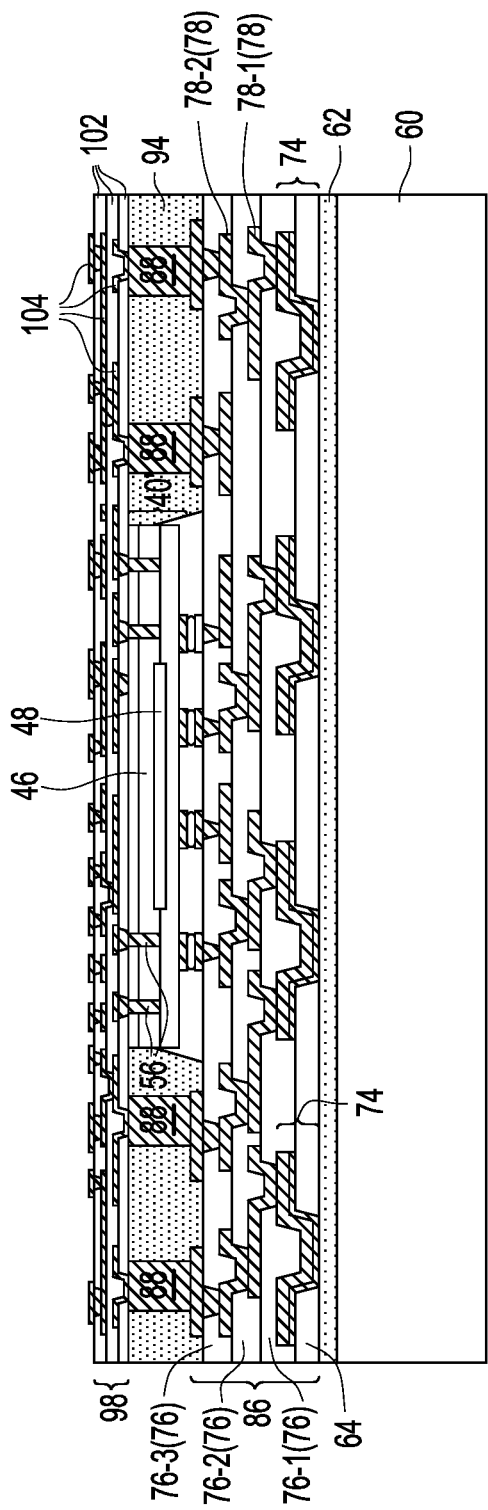
Figure 14:
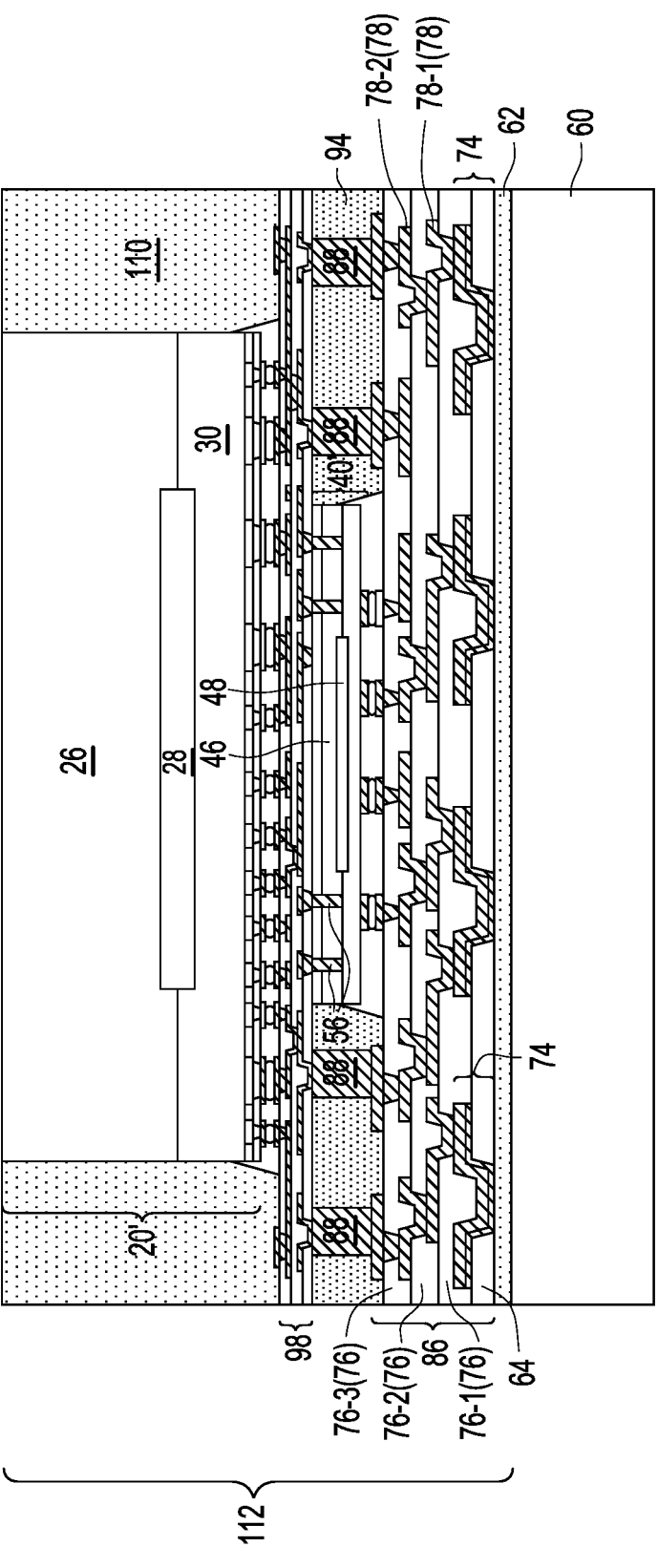

Referring to FIG. 12, backside interconnect structure 98 is formed. The respective process is illustrated as process 222 in the process flow 200 as shown in FIG. 42. As shown in FIG. 14, backside interconnect structure 98 includes dielectric layers 102 and RDLs 104. RDLs 104 may be formed of or comprise copper, aluminum, nickel, titanium, or the like, or multi-layers thereof. Each of dielectric layers 102 may be formed of or comprise inorganic materials and/or organic materials. The inorganic materials may include silicon nitride, silicon oxide, silicon carbide, silicon oxynitride, silicon oxy-carbo-nitride, or the like, combinations thereof, and/or multi-layers thereof. The organic materials may include polyamide, PBO, or the like. The formation process may be similar to the formation of dielectric layers 76 and RDLs 78, and are not repeated herein.

Figure 13:
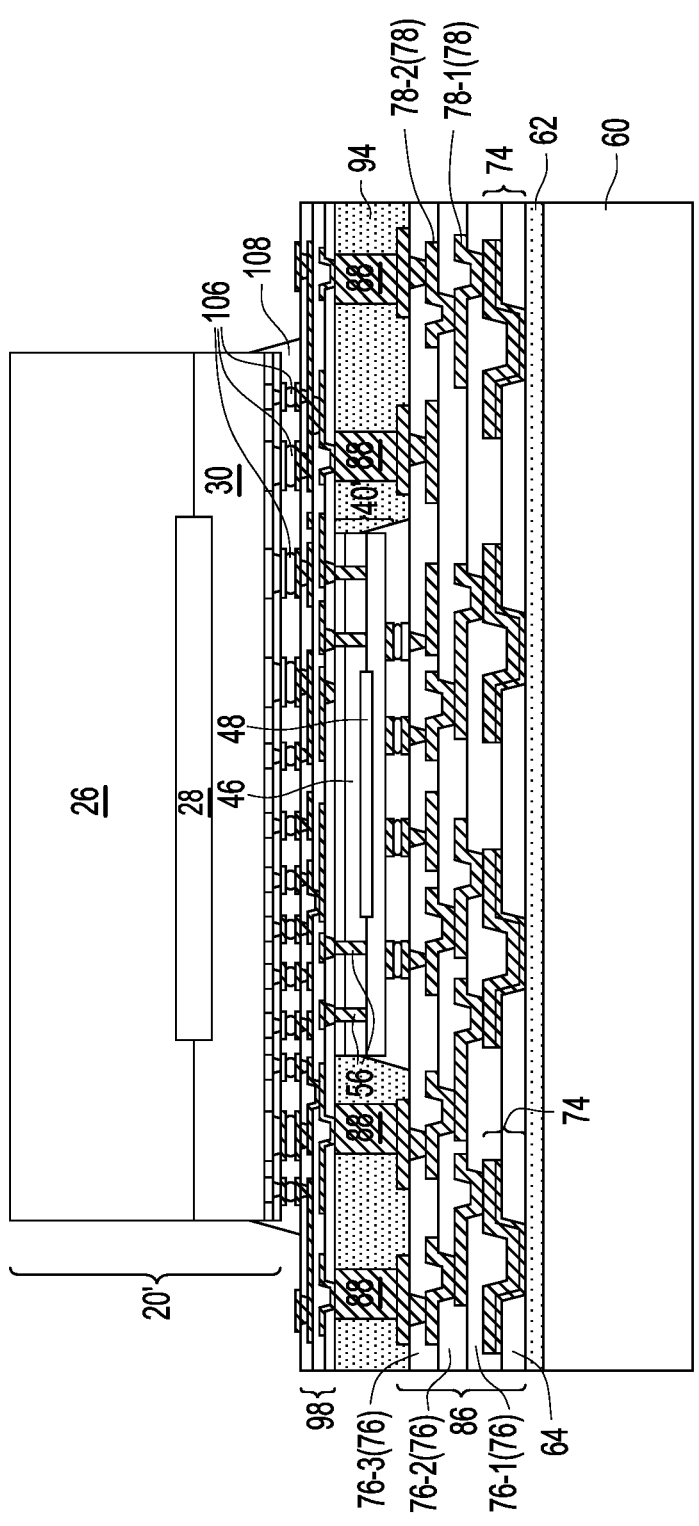

FIG. 13 illustrates the bonding of device die 20' to backside interconnect structure 98. The respective process is illustrated as process 224 in the process flow 200 as shown in FIG. 42. The bonding may be performed through solder bonding, metal-to-metal direct bonding, or the like. In accordance with some embodiments, the bonding is performed through solder regions 106. After the bonding, underfill 108 is dispensed into the gap between device die 20' and the underlying backside interconnect structure 98. The bonding may be performed through a face-to-back bonding, wherein the front side (the face) of device die 20' faces the backside (the back) of TSV die 40'. This may save a carrier in the package formation process. Otherwise, another carrier (other than carrier 60) may be needed to form the backside structure on the backside of TSV die 40'.

Next, referring to FIG. 14, encapsulant 110 is dispensed to encapsulate device die 20' therein. The respective process is illustrated as process 226 in the process flow 200 as shown in FIG. 42. Encapsulant 110 may include a molding compound, a molding underfill, or the like. Each of underfill 108 and encapsulant 110 may include a base material, which may be a polymer, a resin, an epoxy, or the like, and filler particles in the base material. The filler particles may be dielectric particles of silica, alumina, boron nitride, or the like, and may have spherical shapes. A planarization process such as a CMP process or a mechanical grinding process is performed to thin encapsulant 110 and device die 20', until the semiconductor substrate 26 of device die 20' is revealed. The structure formed over release film 62 is referred to as reconstructed wafer 112 hereinafter.

Figure 15:
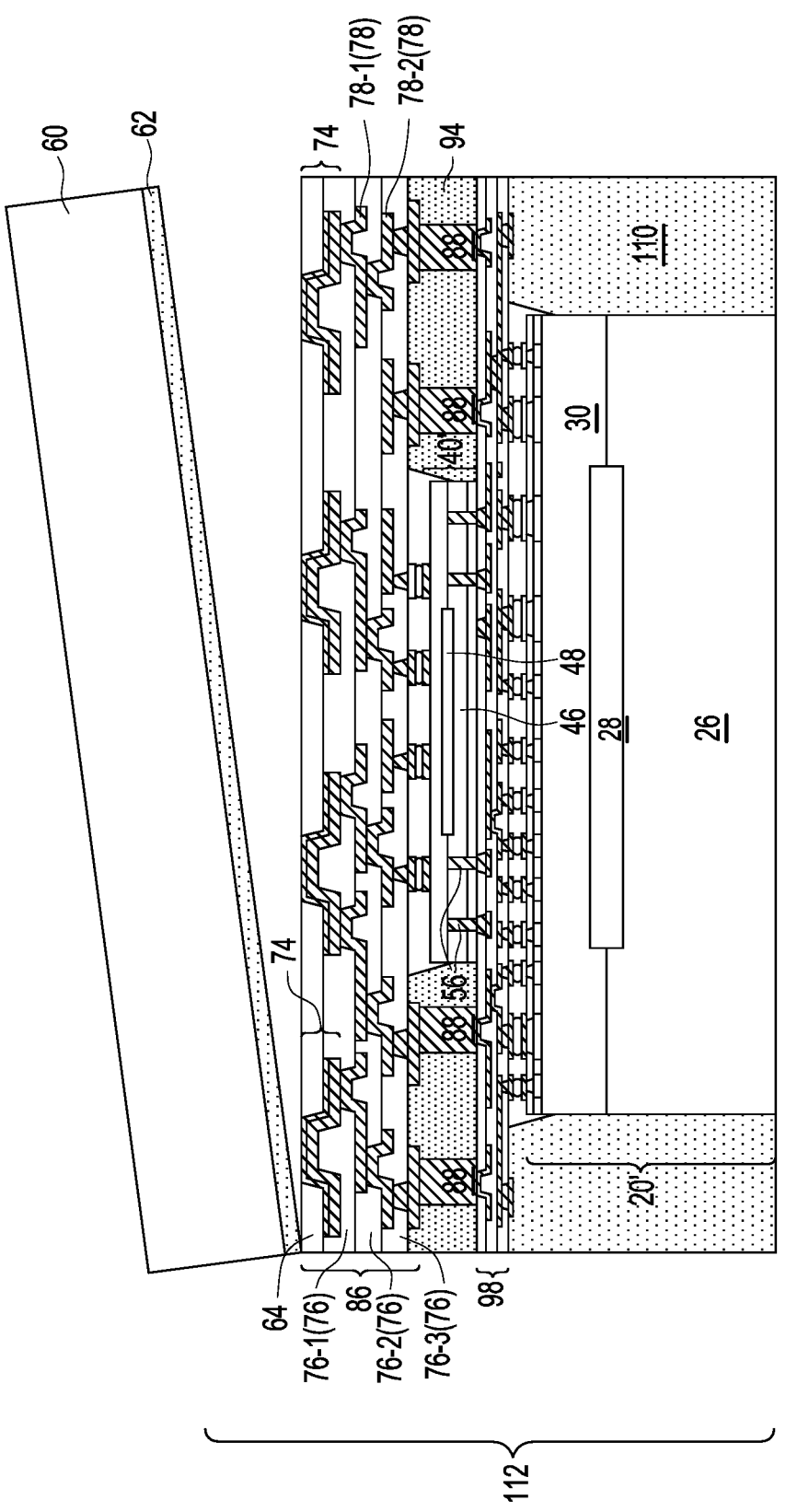

FIG. 15 illustrates the de-bonding of carrier 60 from reconstructed wafer 112. The respective process is illustrated as process 228 in the process flow 200 as shown in FIG. 42. In the de-bonding process, a light beam (which may be a laser beam) is projected on release film 62, and the light beam penetrates through the transparent carrier 60. Release film 62 is thus decomposed. Carrier 60 may be lifted off from release film 62, and hence reconstructed wafer 112 is de-bonded (demounted) from carrier 60.

Figure 16:
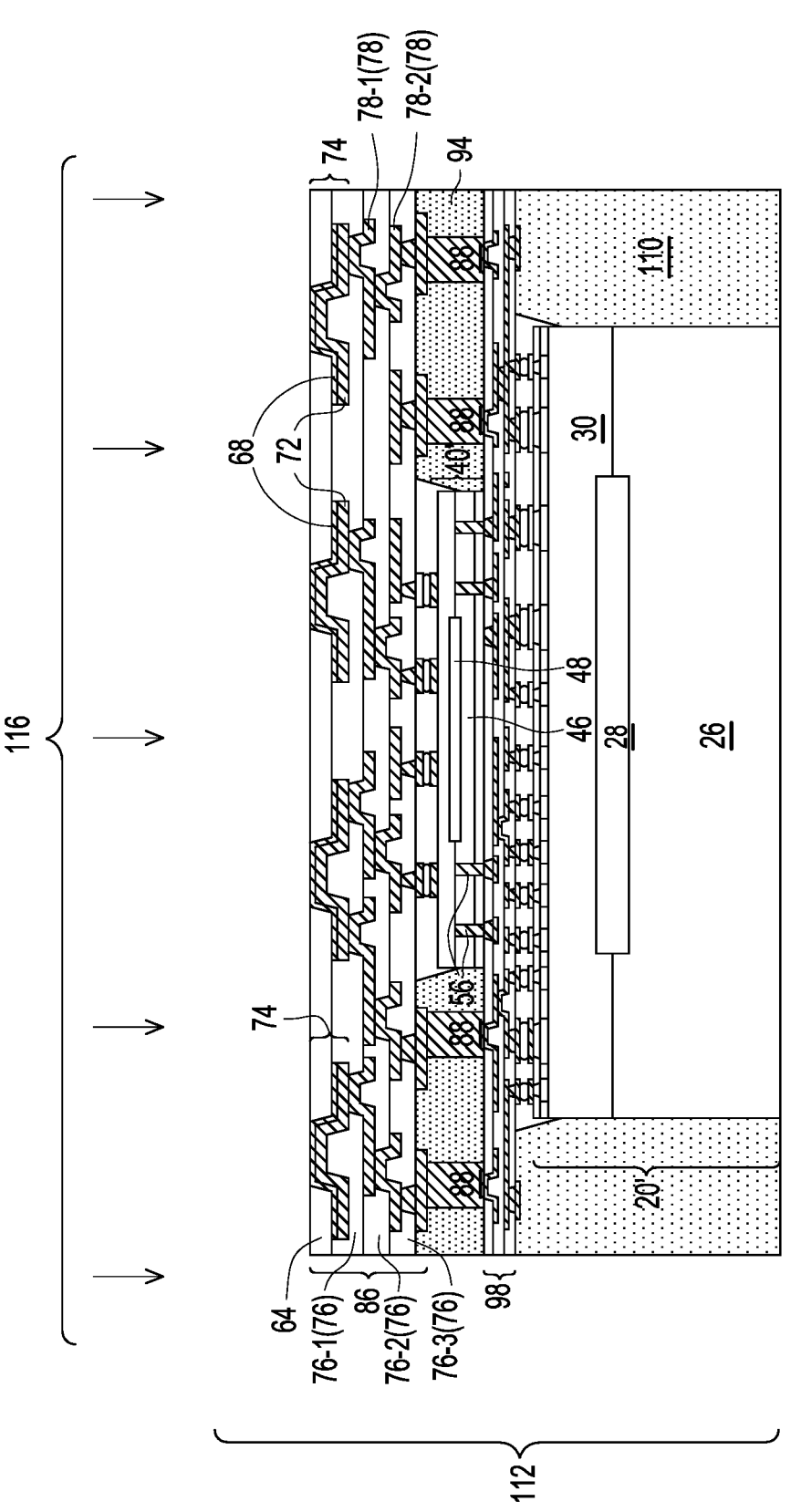
Figure 38:
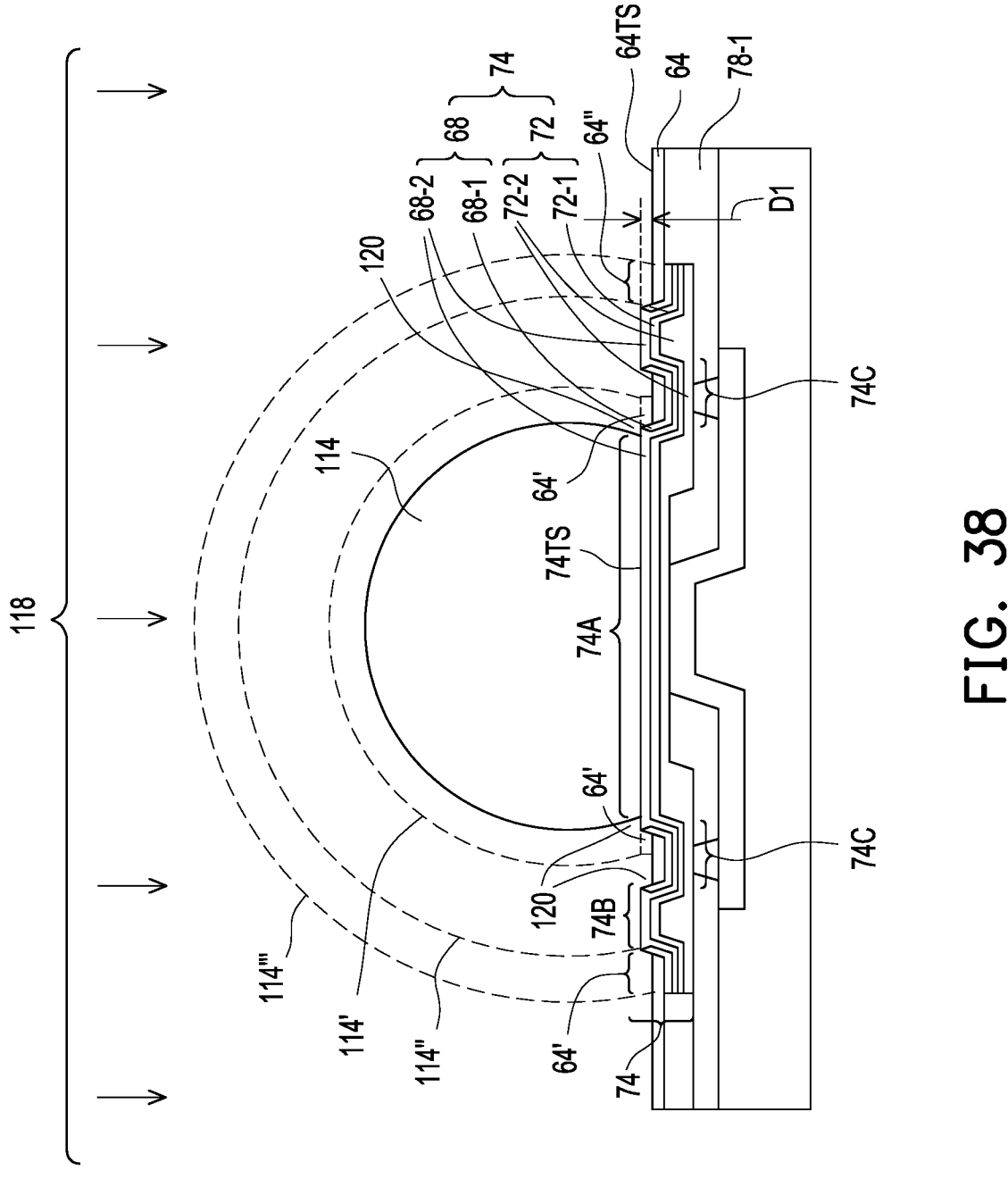
FIG. 38 illustrates a cross-sectional view of a dielectric layer recessed from an under-bump metallurgy in accordance with some embodiments.

FIG. 16 illustrates etching process 116, which is used to etch the titanium layer in UBM 74. A resulting UBM 74 is illustrated in FIG. 38, which shows the etched titanium layer 68-1 and the exposed copper layer 68-2 in metal seed layer 68. The titanium layer 68-1 may be the topmost layer in metal seed layer 68. Since the titanium layer has a high resistivity, removing the titanium layer may reduce the resistance of the resulting electrical paths that include UBMs 74. In accordance with some embodiments, the etching is performed using the copper layer 68-2 (FIG. 38) in metal seed layer 68 as an etch stop layer. Also, dielectric layer 64 may act as the etch stop layer. Accordingly, the portions of the titanium layer 68-1 exposed through dielectric layer 64 are removed, while the portions of the titanium layer 68-1 inside dielectric layer 64 remain after the etching process 116 (FIG. 16). The remaining portions of the titanium layer 68-1 in dielectric layer 64 may also form rings encircling the corresponding portions of copper nickel portions.

Figure 17:
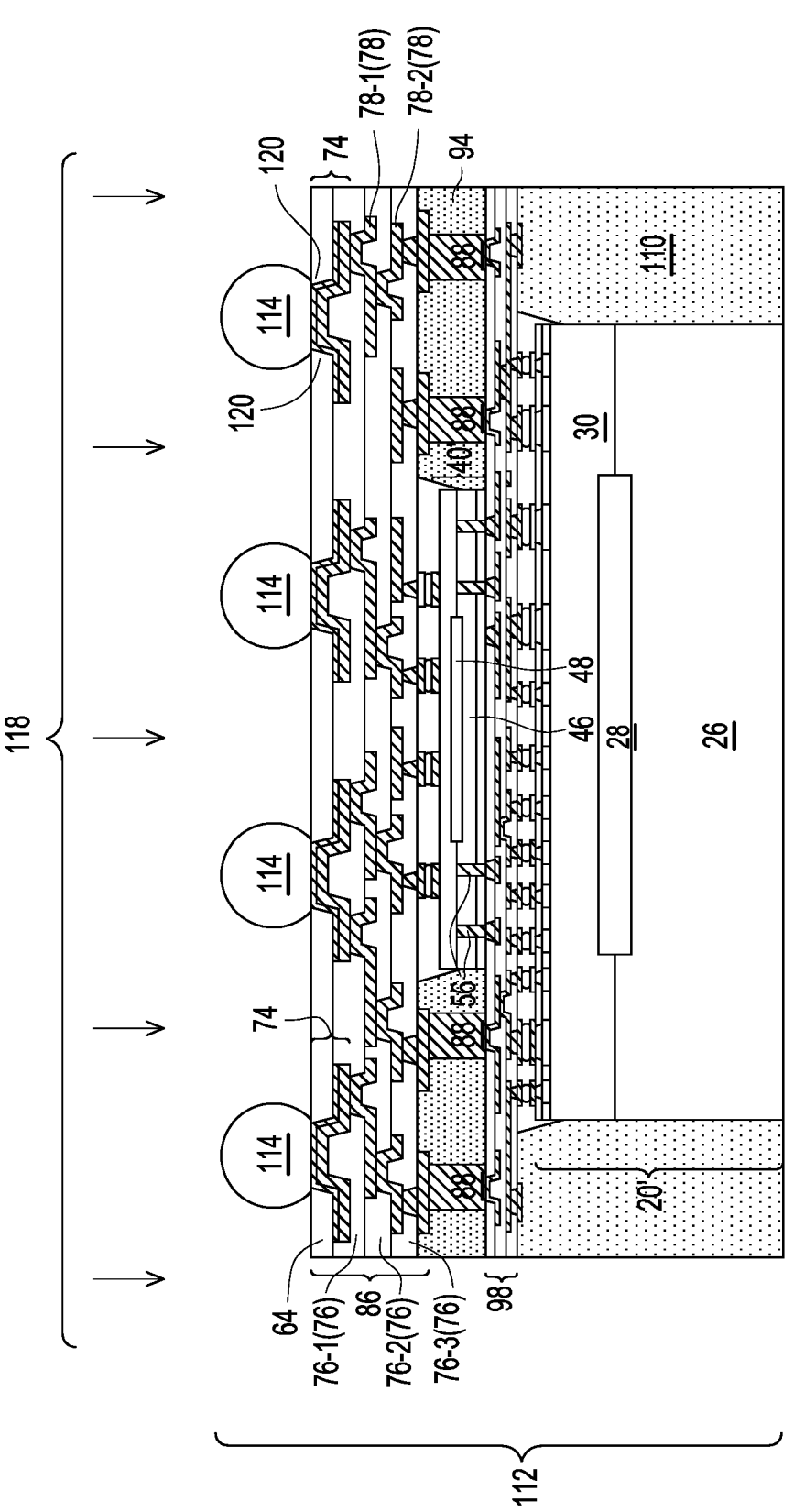

FIG. 17 illustrates the formation of electrical connectors 114. The respective process is illustrated as process 230 in the process flow 200 as shown in FIG. 42. The formation process may include placing solder balls on UBMs 74, and then reflowing the solder balls. In accordance with some embodiments, a recessing process 118 is performed after the formation of electrical connectors 114 to recess dielectric layer 64. The respective process is illustrated as process 232 in the process flow 200 as shown in FIG. 42. In accordance with alternative embodiments, recessing process 118 is skipped. The recessing process 118 may include an anisotropic etching/sputtering process, an isotropic etching process, or an etching process comprising both of anisotropic and isotropic components. The recessing may also include a dry etching process and/or a wet etching process. For example, when the dry etching process is used, a process gas comprising (such as $O_2$), nitrogen (such as $N_2$), argon, and/or the like may be used. During etching process 118, either electrical connectors 114 and UBMs 74 are not recessed, or electrical connectors 114 and UBMs 74 are recessed at a slower rate than dielectric layer 64.

FIG. 38 illustrates an amplified view of a portion of the structure shown in FIG. 17. After the recessing process 118, the top surface 64TS of dielectric layer 64 is recessed lower than the top surface 74TS of UBMs 74. The recessing distance D1 may be greater than about 0.1 μm, and may be in the range between about 0.1 μm and about 1 μm. Recessing process 118 has the function of reducing delamination. If recessing process 118 is not performed, at the top corners 120 (FIGS. 17 and 38) where dielectric layer 64 joins UBM 74, there may be delamination, and the delamination may propagate down. By recessing dielectric layer 64, the possibility of the delamination and propagation is reduced.

Figure 18:
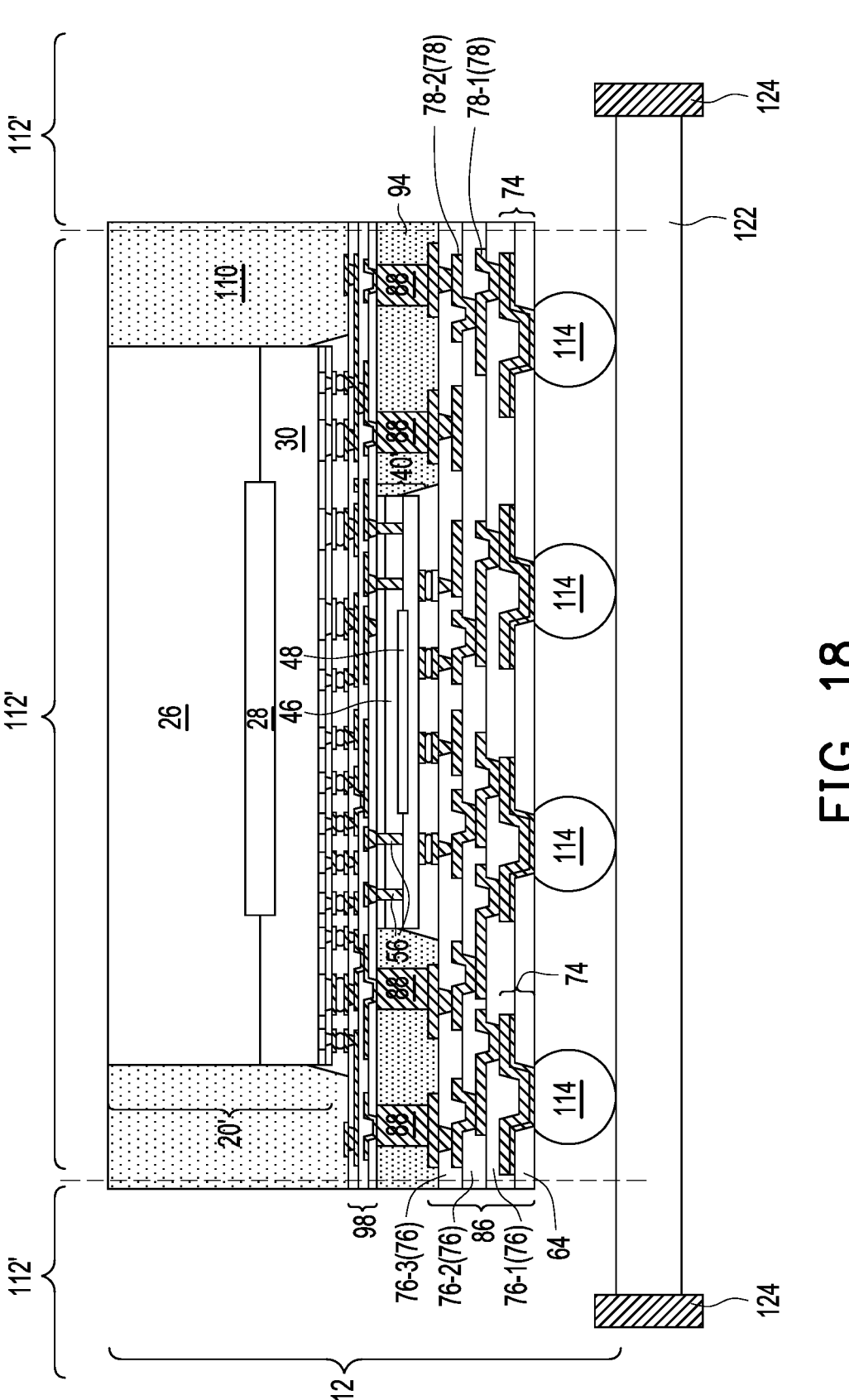

Referring to FIG. 18, reconstructed wafer 112 is placed on dicing tape 122, which is attached to frame 124. A singulation process is then performed to saw reconstructed wafer 112 into discrete packages 112'. The respective process is illustrated as process 234 in the process flow 200 as shown in FIG. 42.

Figure 19:
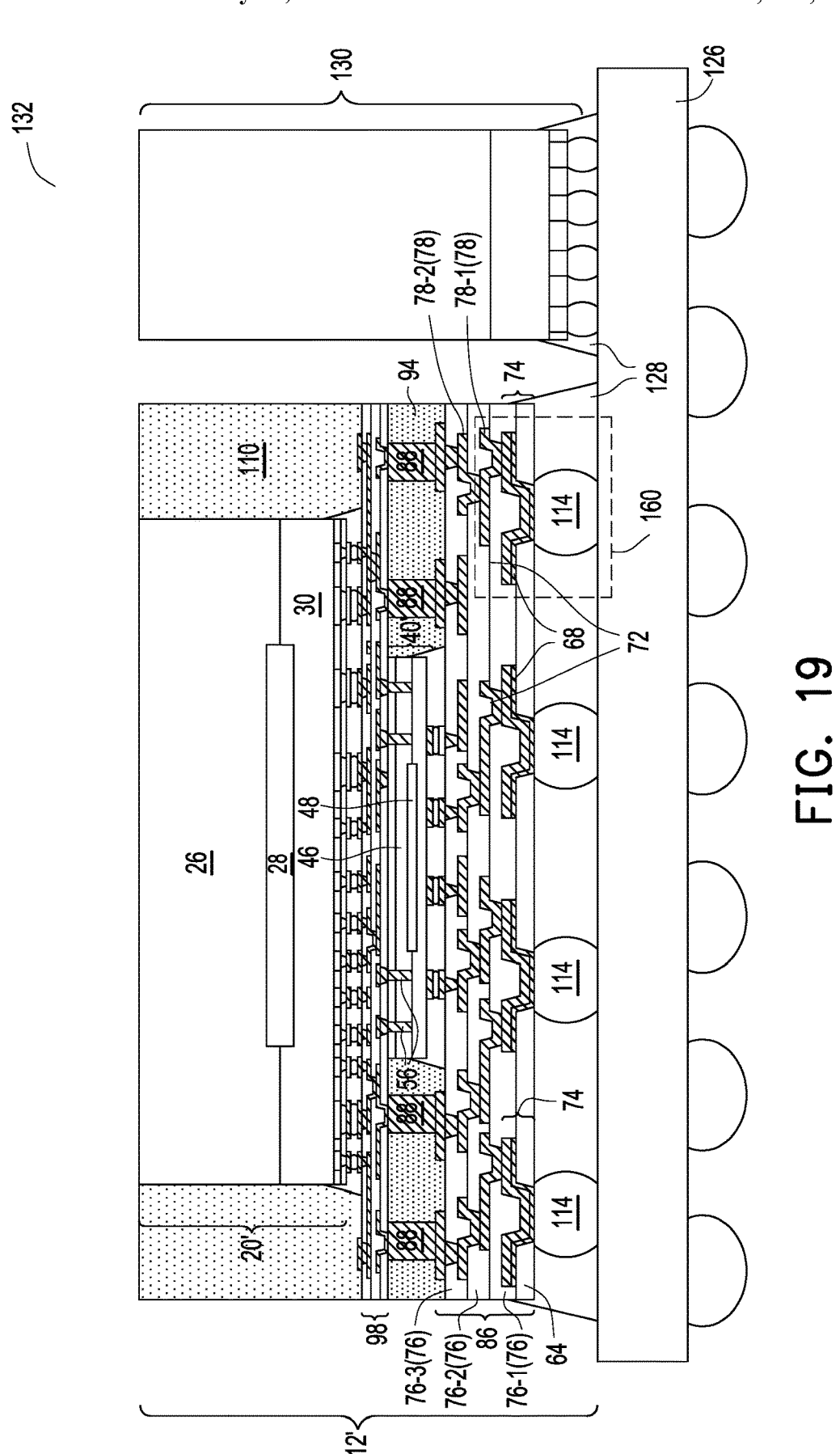
Figure 20:
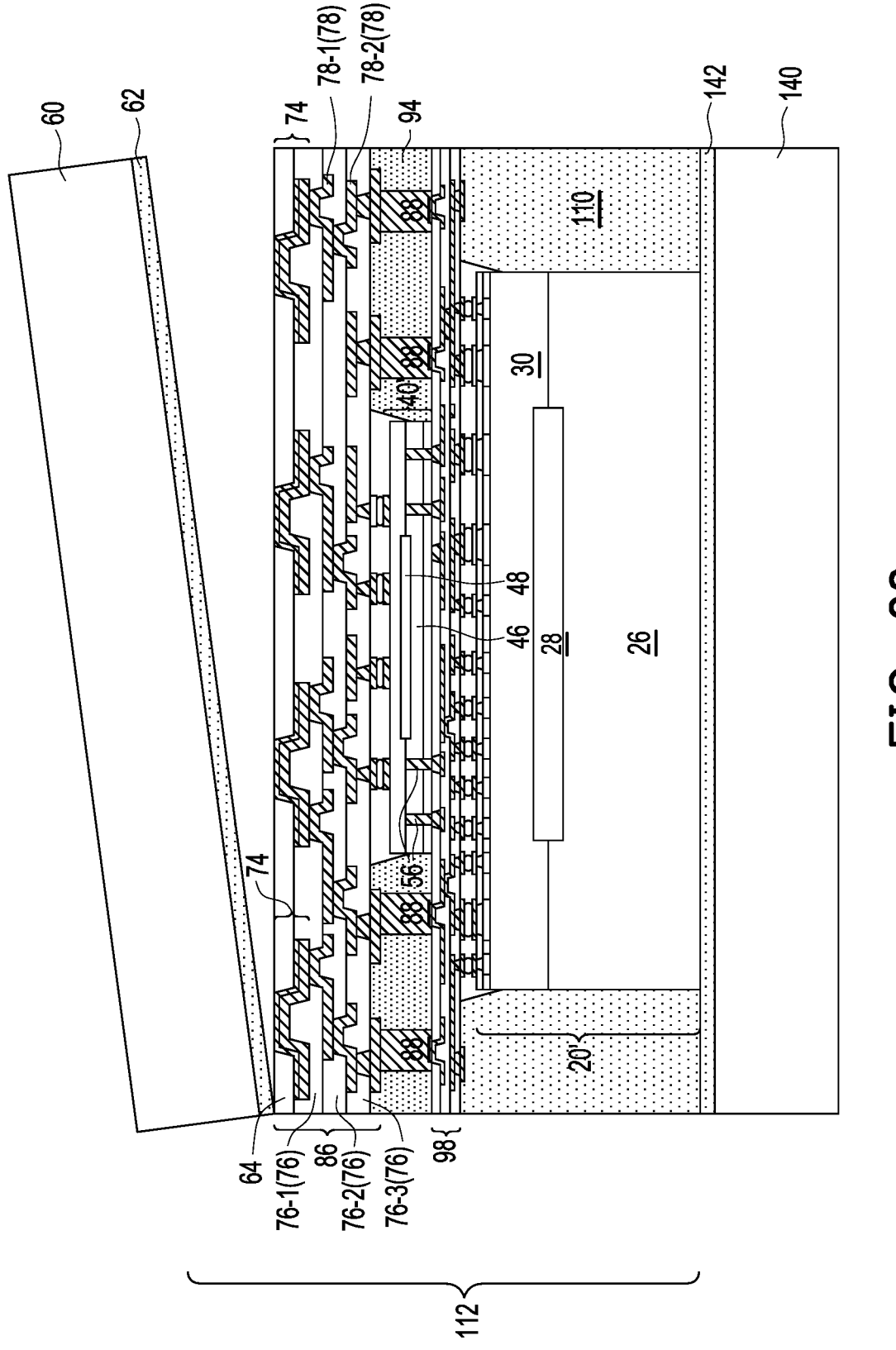
FIGS. 20 through 25 illustrate the intermediate stages in the formation of a package in accordance with some embodiments.

FIG. 19 illustrates the formation of package 132, which includes package 112' bonding to package component 126. The respective process is illustrated as process 236 in the process flow 200 as shown in FIG. 42. Package component 126 may be a package substrate, a printed circuit board, or the like. In accordance with some embodiments, package component 130 is also bonded to package component 126. Package component 130 may include a memory stack including stacked memory dies therein. The memory dies may include Dynamic Random-Access Memory (DRAM) dies, Static Random-Access Memory (SRAM) dies, or the like. Accordingly, the memory stack 130 is outside of package 112' in accordance with these embodiments. Underfill 128 is also dispensed.

FIGS. 20-25 illustrate the cross-sectional views of intermediate stages in the formation of a package in accordance with alternative embodiments. These embodiments are similar to the embodiments shown in FIGS. 1-19, except that two carriers are used in order to form metal posts (pillars) as bond structures. Unless specified otherwise, the materials, the structures, and the formation processes of the components in these embodiments are essentially the same as the like components denoted by like reference numerals in the preceding embodiments. The details regarding the materials, the structures, and the formation processes of the components shown in FIGS. 20-25 (and FIGS. 26-34) may thus be found in the discussion of the preceding embodiments.

The initial steps of these embodiments are essentially the same as shown in FIGS. 1-14, and hence are not repeated herein. In a subsequent process, as show in FIG. 20, a carrier-switch process is performed. In the carrier-switch process, reconstructed wafer 112 is first attached to carrier 140 through release film 142. Carrier 140 is formed of a transparent material, and may be a glass carrier, a ceramic carrier, or the like. Release film 142 may be formed of an LTHC coating material. Carrier 60 is then de-bonded from reconstructed wafer 112. In the de-bonding process, a light beam (which may be a laser beam) is projected on release film 62, and the light beam penetrates through the transparent carrier 60. Release film 62 is thus decomposed. Carrier 60 is lifted off from release film 62, and hence reconstructed wafer 112 (along with interconnect die 30) is de-bonded (demounted) from carrier 60.

Figure 21:
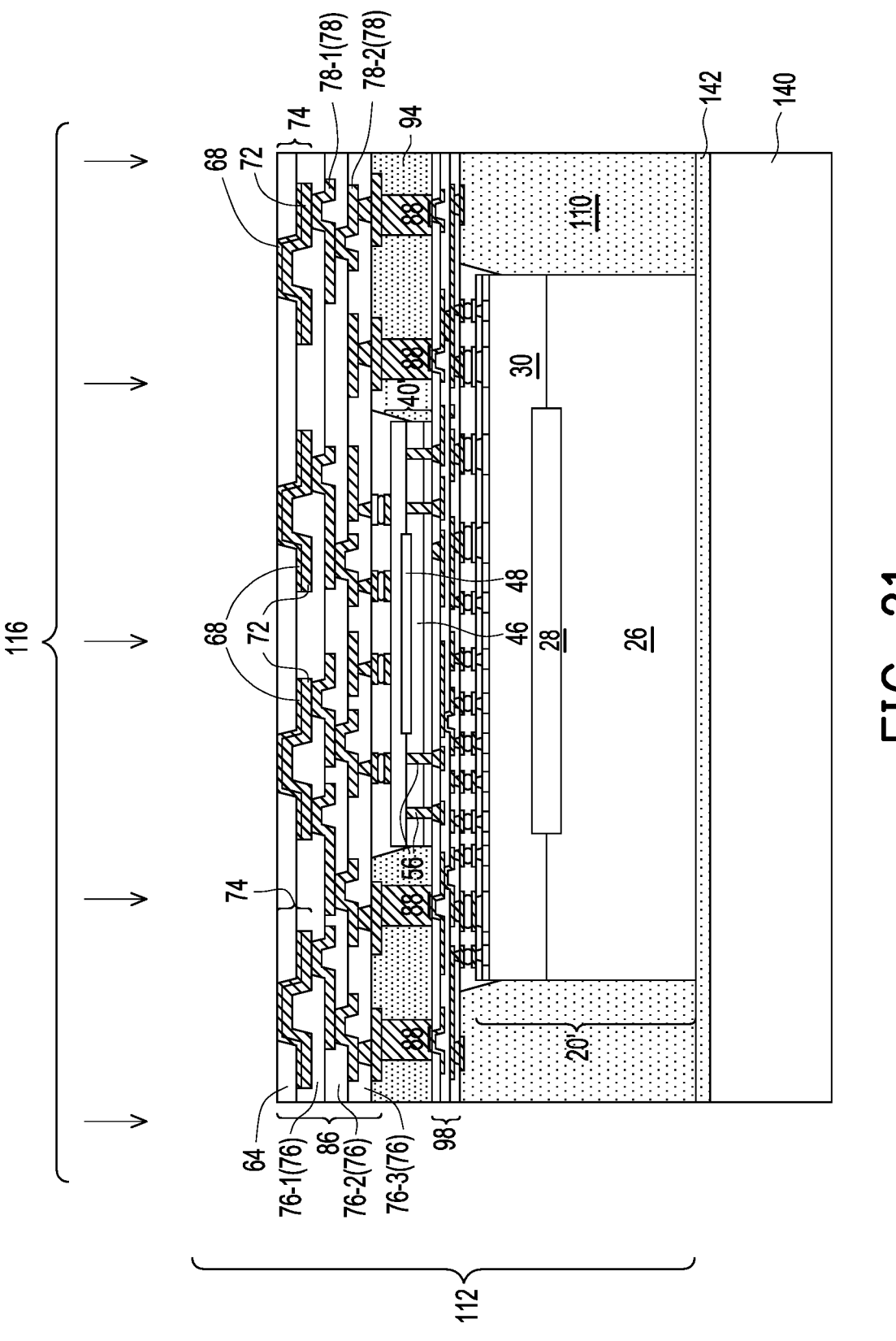
Figure 22:
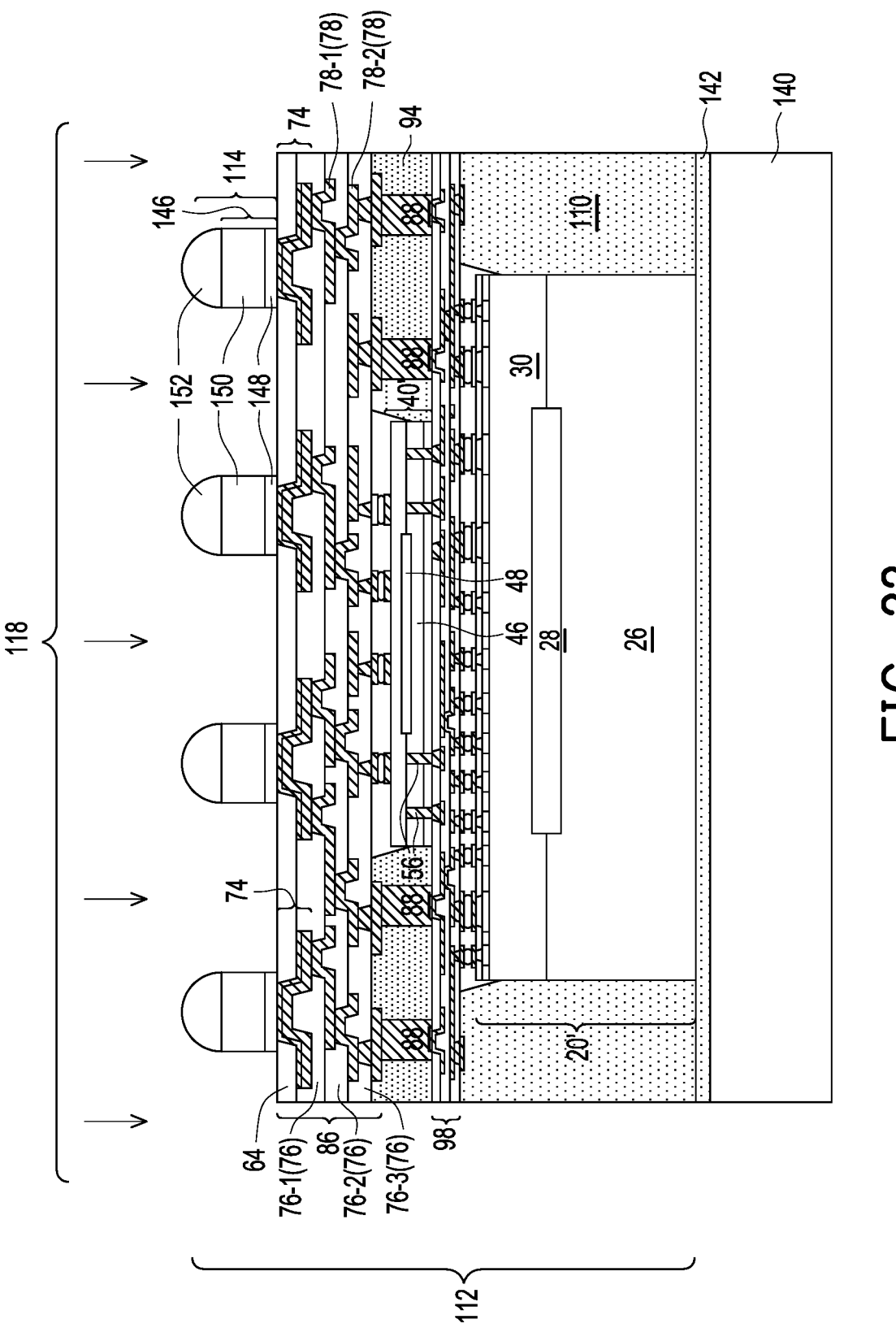

FIG. 21 illustrates etching process 116 for etching the titanium layers in UBMs 74. The resulting UBMs 74 may also be shown in FIGS. 35 and 38. Next, referring to FIG. 22, electrical connectors 114 are formed. Carrier 140 is used for the formation of electrical connectors 114 that include metal pillars, which may be formed as having a smaller pitch than the pitch of the electrical connectors 114 in FIG. 17, which are solder regions. In accordance with some embodiments, the formation of electrical connectors 114 includes depositing a blanket metal seed layer, forming a plating mask (not shown) over the metal seed layer, plating a metallic material (such as copper) 150 over the blanket metal seed layer, and plating a solder layer 152 over metallic material 150. The plating mask is then removed, followed by an etching process to remove the exposed portions of the metal seed layer. The remaining portions of the metal seed layer are metal seed layers 148, which form metal pillars 146 along with metallic material 150. A reflow process is then performed to reflow solder regions 152.

Figure 35:
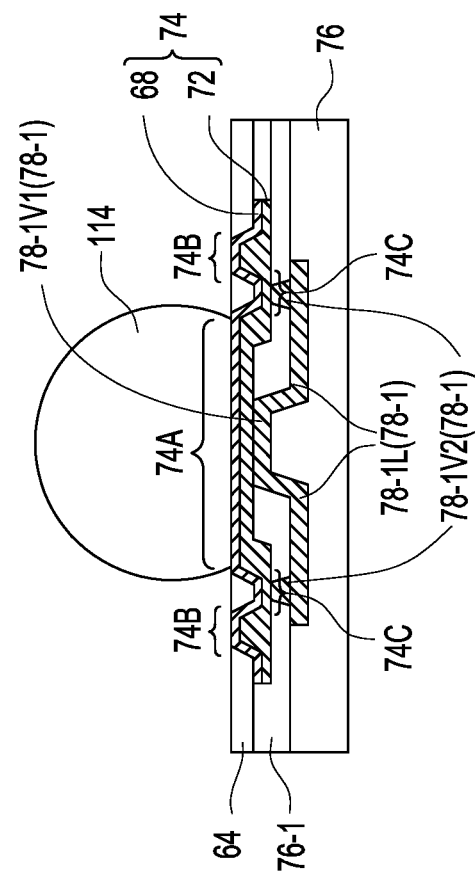
FIG. 35 illustrates a cross-sectional view of an under-bump metallurgy in accordance with some embodiments.

In accordance with some embodiments, etching process 118 is performed to recess dielectric layer 64, and the resulting structure is similar to what is shown in FIG. 38, except the structure of electrical connectors 114 is different. In accordance with alternative embodiments, etching process 118 is not performed, and the resulting structure is similar to what is shown in FIG. 35, except the structure of electrical connectors 114 is different.

Figure 23:
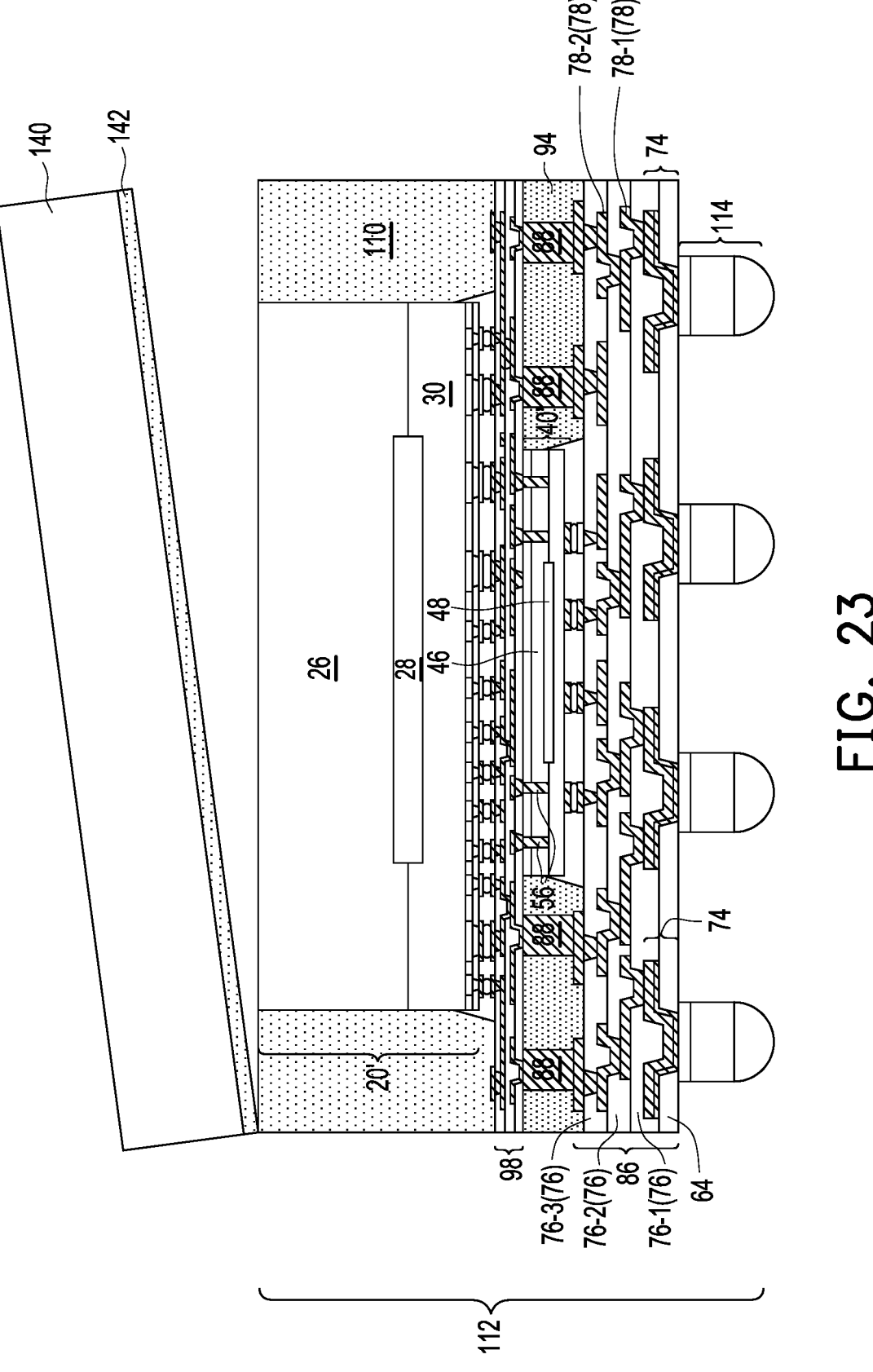
Figure 24:
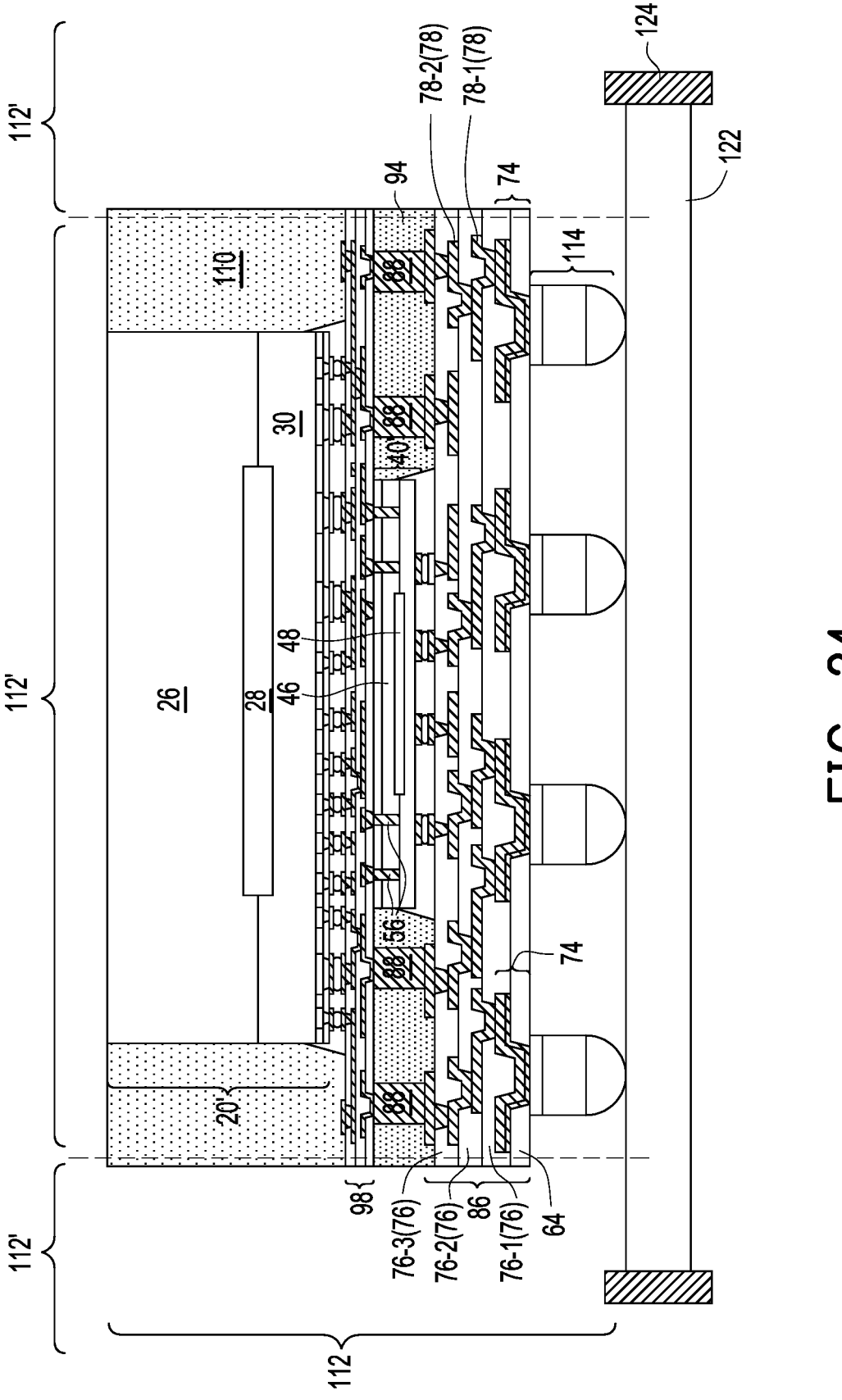
Figure 25:
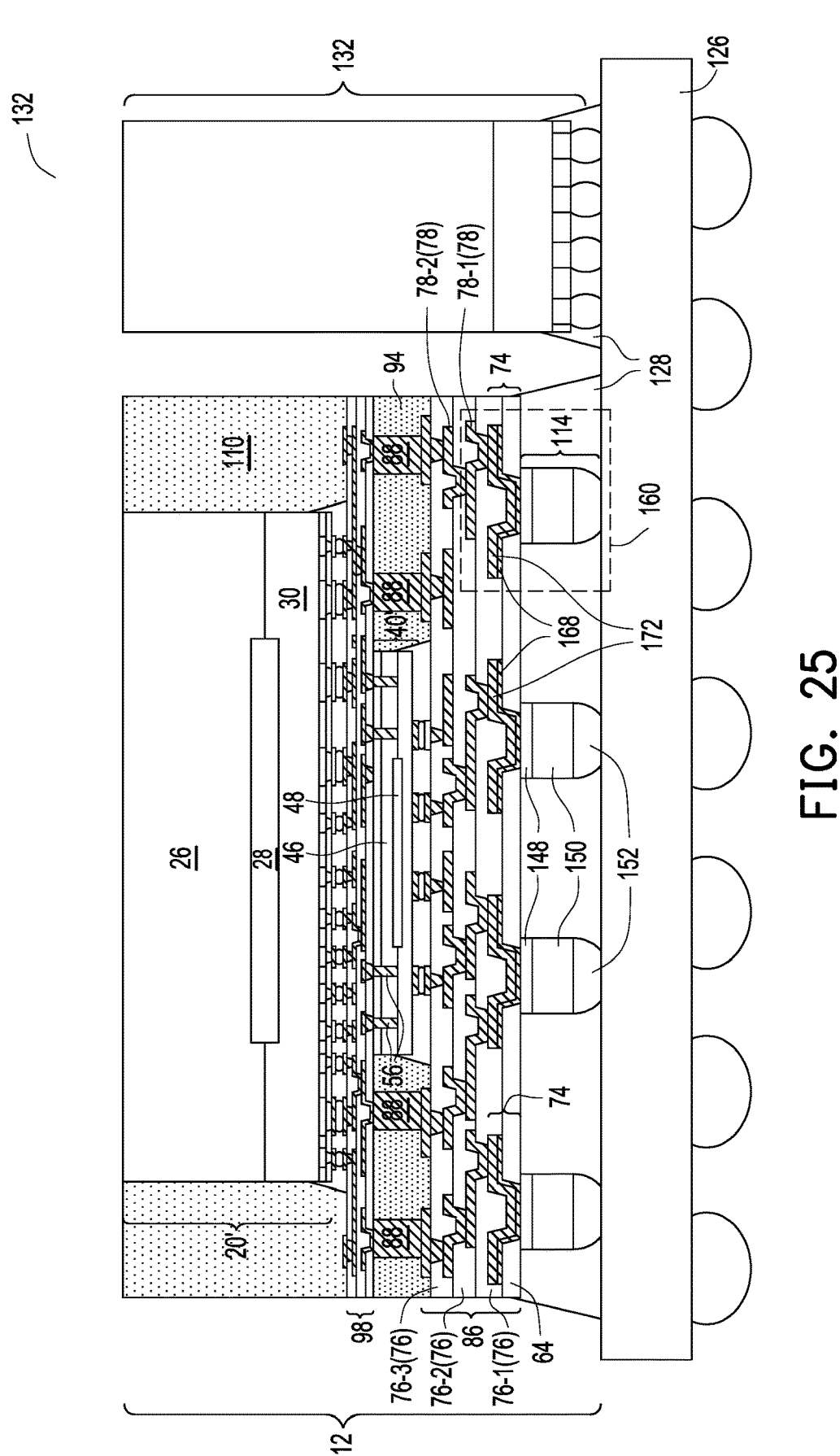

Referring to FIG. 23, reconstructed wafer 112 is de-bonded from carrier 140. In FIG. 24, reconstructed wafer 112 is placed on dicing tape 122, and is sawed as discrete packages 112', which are identical to each other. FIG. 25 illustrates the formation of package 132, which includes package 112' therein.

FIGS. 26-34 illustrate the formation of package 132 in accordance with yet alternative embodiments. These embodiments are similar to the embodiments shown in FIGS. 1-19, except that memory stack 130 is built inside, rather than outside of, package component 112'.

Figure 26:
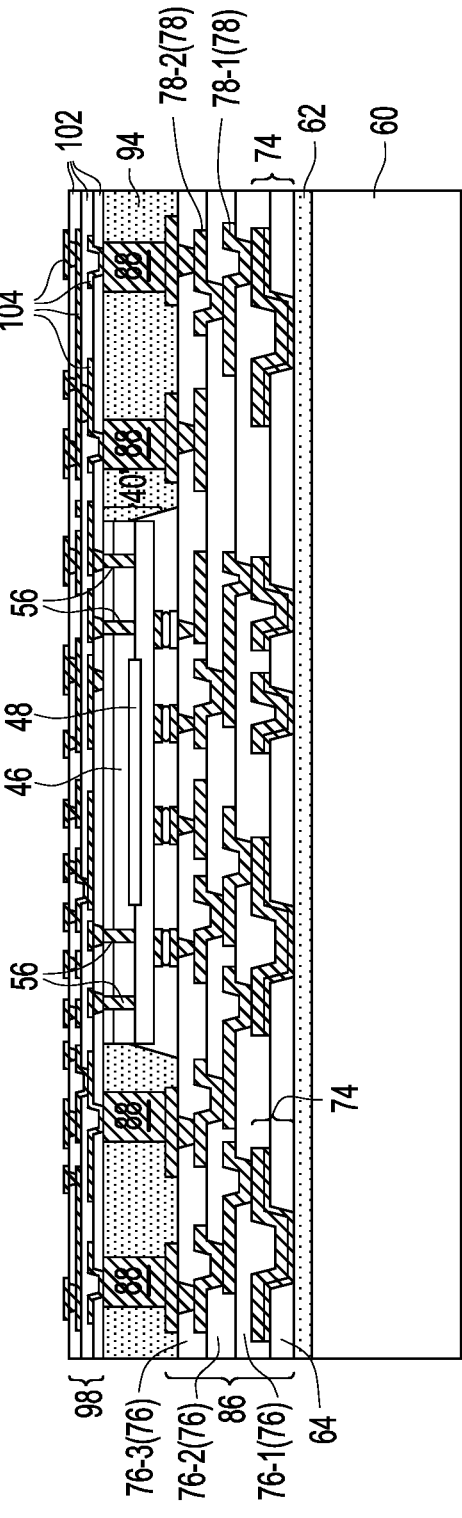
FIGS. 26 through 34 illustrate the intermediate stages in the formation of a package in accordance with some embodiments.
Figure 27:
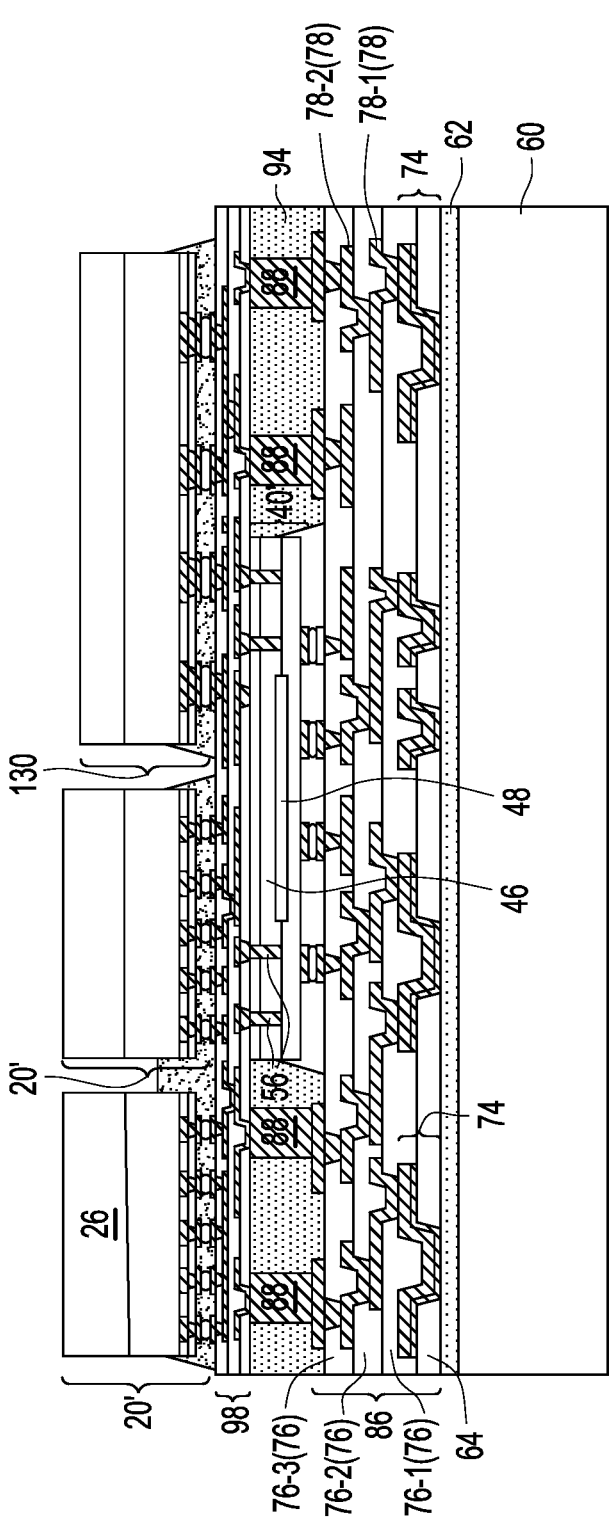

The initial processes of these embodiments are essentially the same as shown in FIGS. 1-12, and hence are not repeated herein. The resulting structure is also shown in FIG. 26. In a subsequent process, as show in FIG. 27, device dies 20' are bonded to interconnect structure 98. Also, memory stack 130, which may be essentially the same as memory stack 130 in FIG. 19, is bonded to interconnect structure 98.

Figure 28:
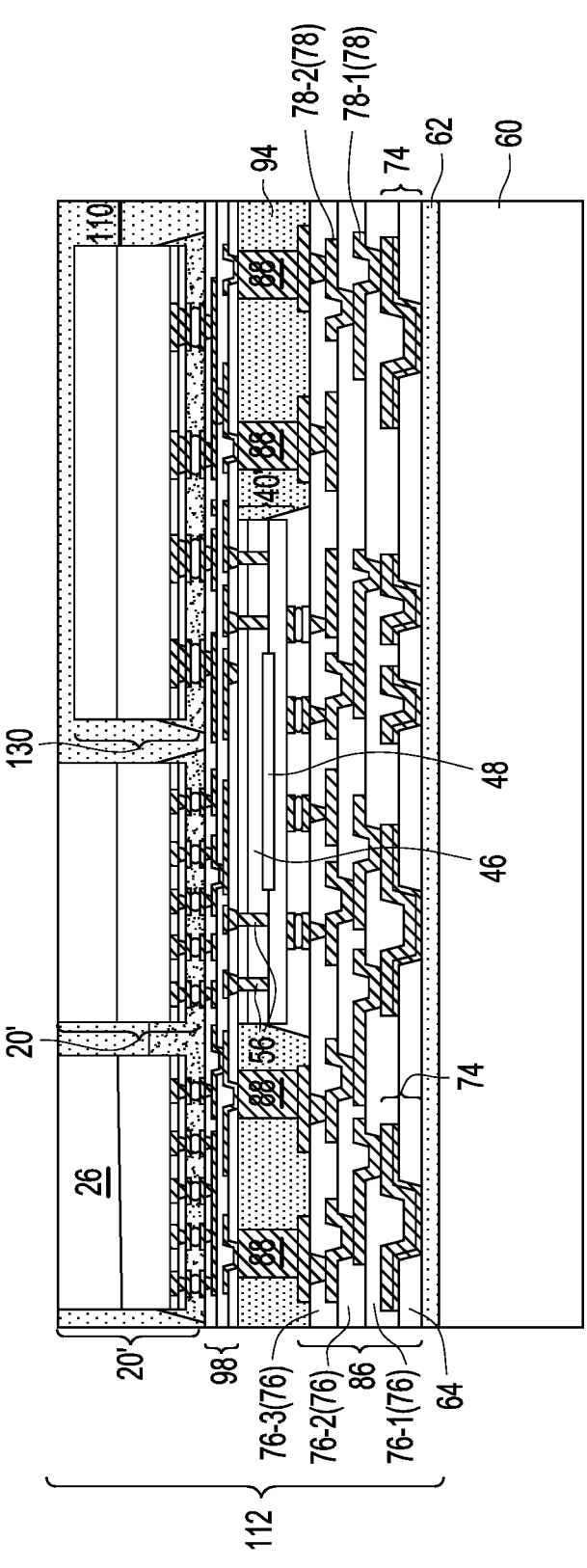
Figure 29:
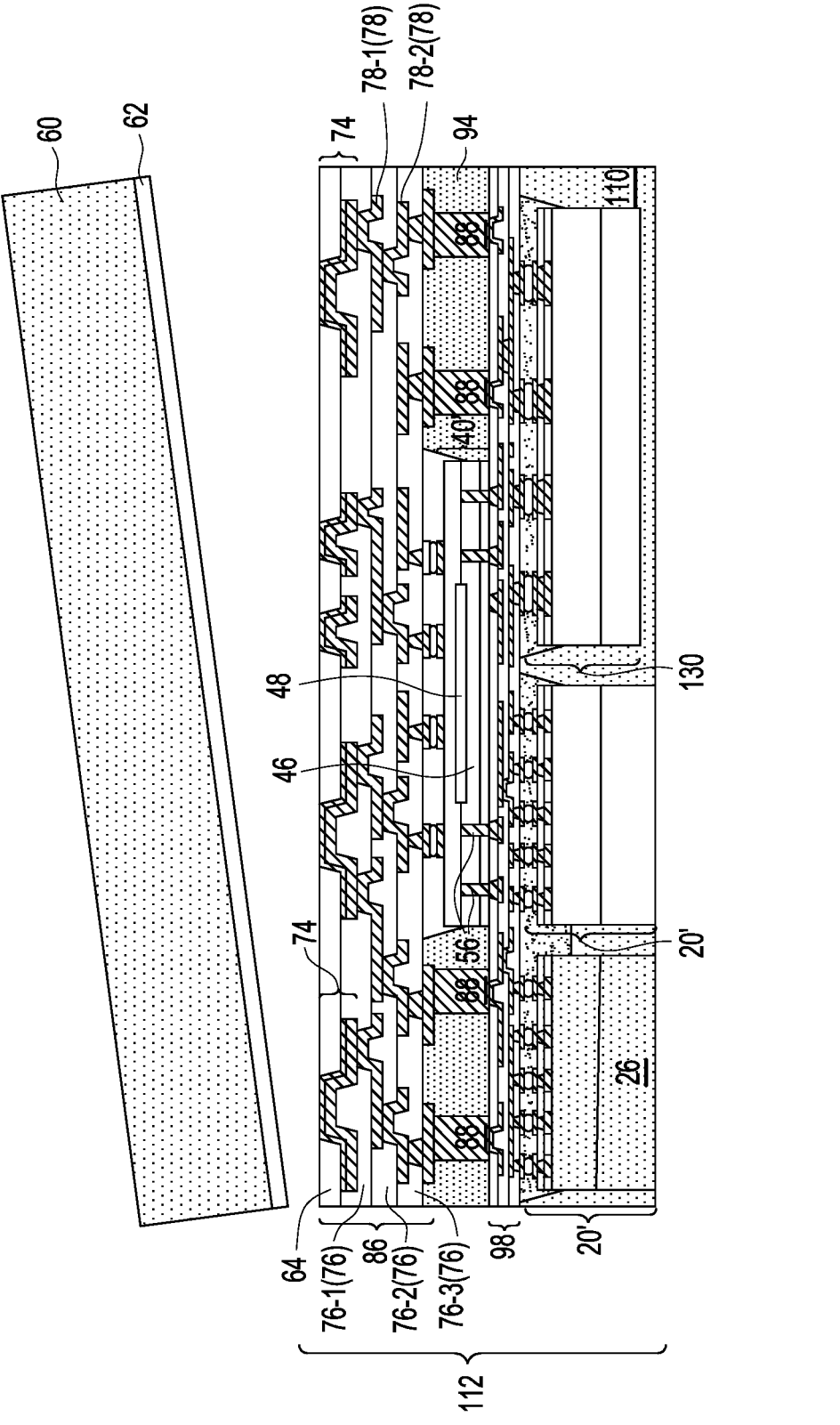
Figure 30:
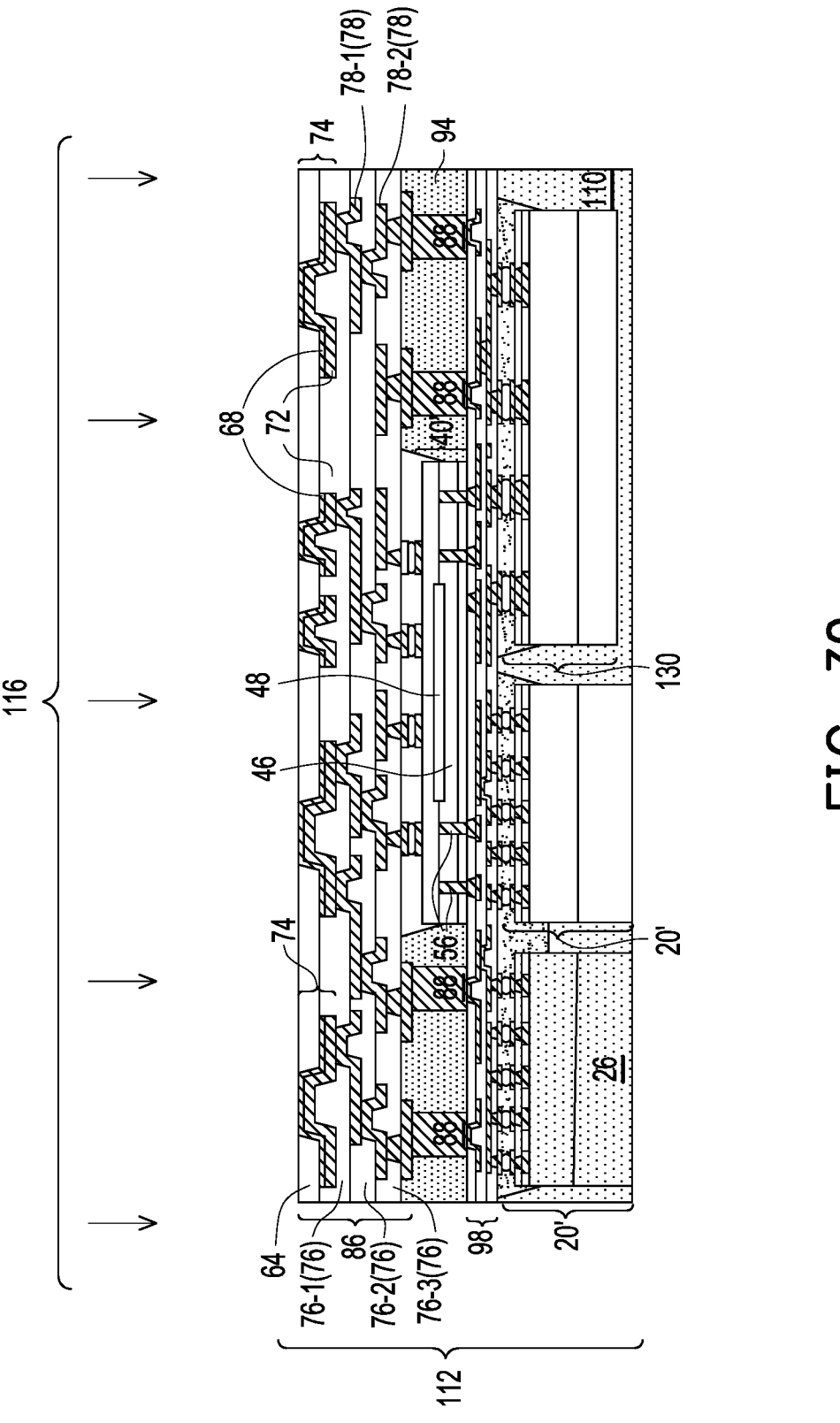

Next, as shown in FIG. 28, device dies 20' and memory stack 130 are encapsulated in encapsulant 110, hence forming reconstructed wafer 112. The reconstructed wafer 112 is then de-bonded from carrier 60, as shown in FIG. 29. In subsequent processes, as shown in FIG. 30, etching process 116 is performed to remove the titanium layer in UBMs 74.

The resulting UBMs 74 may be found in FIG. 38. It is appreciated that no more carrier is attached to reconstructed wafer 112 in subsequent processes.

Figure 31:
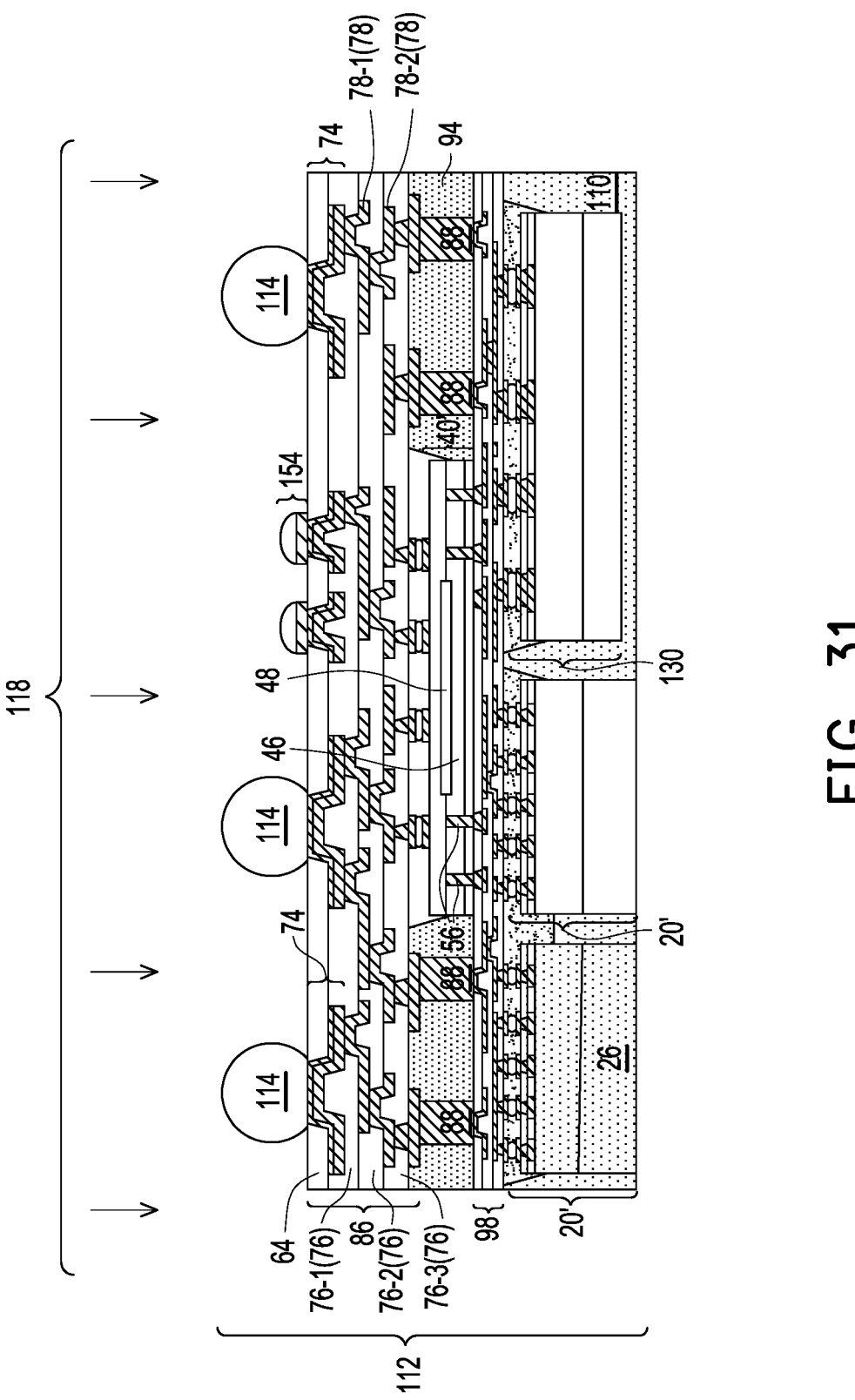

In FIG. 31, electrical connectors 114 and electrical connectors 154 are formed on the top surface of reconstructed wafer 112. Recessing process 118 may then be performed to recess dielectric layer 64 in accordance with some embodiments. The resulting dielectric layer 64 and UBMs 74 are similar to what are shown in FIG. 38. In accordance with alternative embodiments, recessing process 118 is skipped.

Figure 32:
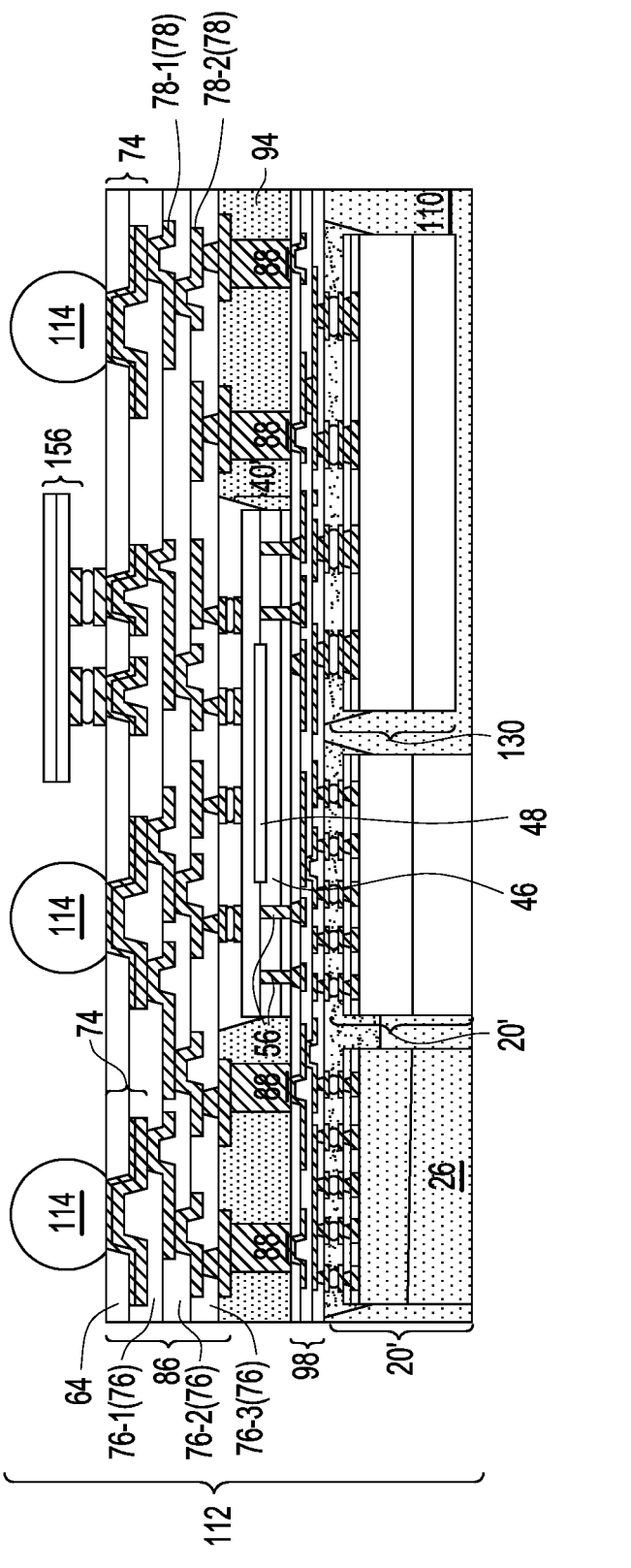
Figure 33:
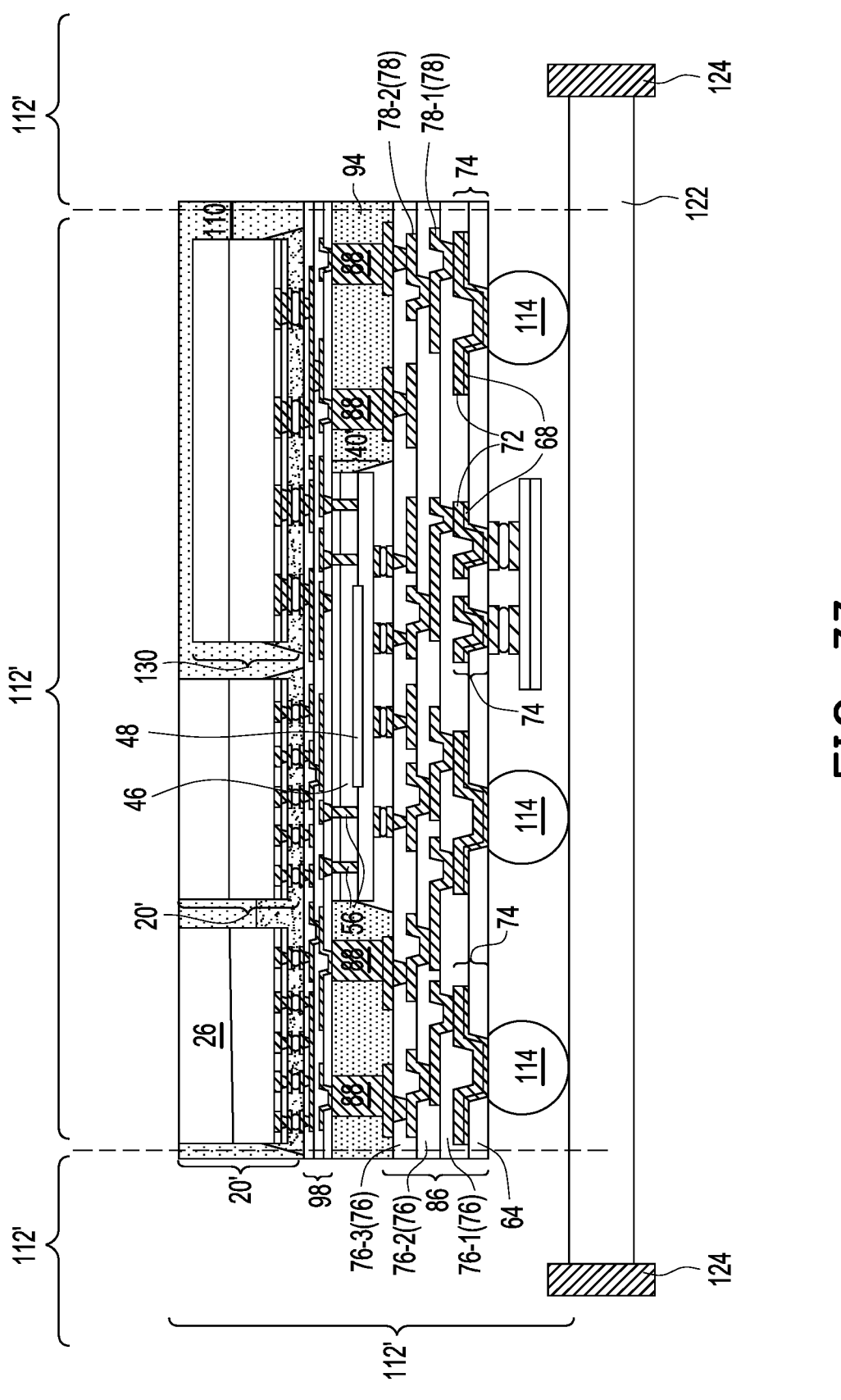

Referring to FIG. 32, package component 156 is bonded to reconstructed wafer 112. Package component 156 may be an IPD such as a capacitor die, an inductor die, or the like. Next, as shown in FIG. 33, reconstructed wafer 112 is placed on dicing tape 122, and reconstructed wafer 112 is sawed into discrete packages 112', which are identical to each other. FIG. 33 illustrates the formation of package 132, which includes package 112' therein. In package 132, memory stack 130 is built inside, rather than outside of, package 112'.

FIG. 35 illustrates a cross-sectional view of an UBM 74 in accordance with some embodiments. The structure illustrated in FIG. 35 may be in regions 160 in FIGS. 19, 25, and 34, except that the structures of electrical connectors 114 may be different from what is shown in FIG. 35, and that FIG. 35 also illustrates an upside-down view of the structures shown in FIGS. 19, 25, and 34.

As shown in FIG. 35, UBM 74 includes a UBM pad 74A, UBM ring anchor 74B, and embedded portions 74C. Embedded portions 74C interconnect UBM pad 74A and UBM ring anchor 74B, and are also referred to as connecting portions 74C. UBM pad 74A and UBM ring anchor 74B are exposed through dielectric layer 64. Embedded portions 74C are embedded inside dielectric layers 64 and 76. Advantageously, the formation of UBM ring anchor 74B results in UBM 74 to have a higher resistance to the lateral and vertical stress, and the possibility of the delamination between UBM 74 and dielectric layers is also reduced. The UBM pad 74A, UBM ring anchor 74B, and the embedded portions 74C collectively form a ring-shaped basin, with a portion of dielectric layer 64 being in the basin.

FIG. 35 illustrates the structure in which dielectric layer 64 is not recessed. FIG. 38 illustrates an alternative structure similar to the structure shown in FIG. 35, except that recessing process 118 is performed, and the top surface of dielectric layer 64 is recessed lower than the top surface of UBM 74 to form a recess, which is also a recess ring.

Figure 36:
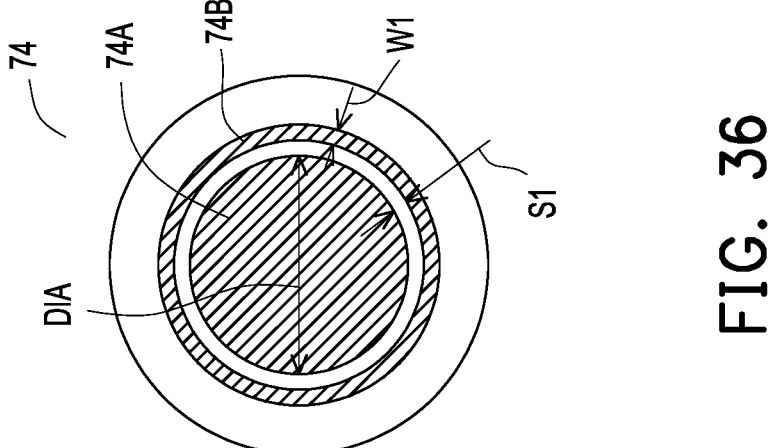
FIG. 36 illustrates a top view of an under-bump metallurgy in accordance with some embodiments.

FIG. 36 illustrates a top view of UBM 74 in accordance with some embodiments. It is appreciated that although the top view of UBM 74 is rounded, UBM 74 may also have other top-view shapes such as rectangular shapes, hexagonal shapes, octagonal shapes, or the like. UBM ring anchor 74B may fully encircle UBM pad 74A in accordance with some embodiments. In accordance with some embodiments, the diameter DIA of UBM pad 74A may be in the range between about 120 μm and about 250 μm. The width W1 of UBM ring anchor 74B may be in the range between about 5 μm and about 20 μm. The spacing S1 between UBM ring anchor 74B and UBM pad 74A may be in the range between about 5 μm and about 20 μm.

Figure 37:
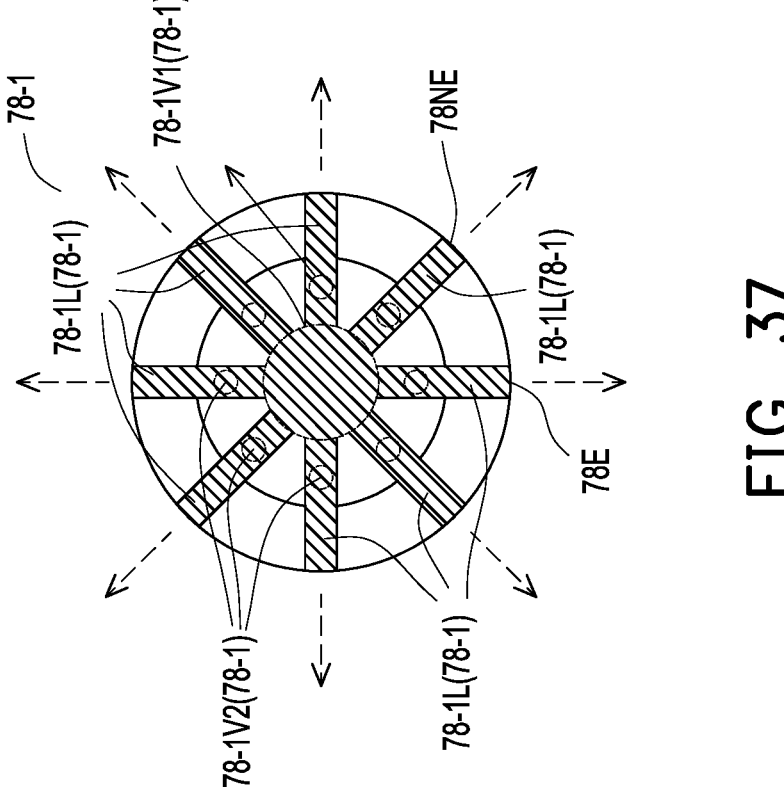
FIG. 37 illustrates a top view of a redistribution line in accordance with some embodiments.

FIG. 37 illustrates a top view of RDL 78-1 in accordance with some embodiments. RDL 78-1 includes via portions 78-1V1 and 78-1V2, and line portions 78-1L, which are also shown in FIG. 35. In accordance with some embodiments, via portion 78-1V1 lands on UBM pad 74A. Via portions 78-1V2 connect line portions 78-1L to the portions of UBM 74 other than UBM pad 74A. Line portions 78-1L may be distributed as having a radius pattern. The pattern of UBM 74 and RDL 78-1 as illustrated has high mechanical strength, and is resistant to delamination. One or more of line portions 78-1L may be used for routing of electrical signal, while some line portions 78-1L may terminate at the positions as illustrated. For example, end 78-E may be a termination end of the corresponding line portions 78-1L, while point 78NE is not the end point of the corresponding line portions 78-1L. The UBM 74 having the radius pattern is advantageous for power distribution.

FIG. 38 illustrates the detailed layers of UBM 74 in accordance with some embodiments. UBM 74 includes metal seed layer 68, which may include titanium layer 68-1 and copper layer 68-2. The top portions of titanium layer 68-1 exposed through dielectric layer 64 are etched in process 116 (FIG. 16, 21, or 30). The portions of titanium layer 68-1 embedded in dielectric layers 64 and 78-1 are protected from the etching process 116. The plated material 72 may include nickel layer 72-1 and copper layer 72-2. It is appreciated that the UBM 74 in FIG. 35 may have essentially the same structure as shown in FIG. 38, although the details are not shown in FIG. 35.

Also, it is appreciated that electrical connector 114 may (or may not) cover some portions of dielectric layer 64, and may possibly cover UBM ring anchor 74B. For example, in FIG. 38, electrical connector 114' represents a possible size of electrical connector 114. Since electrical connector 114' covers some portions of dielectric layer 64, the corresponding underlying portions 64' of dielectric layer 64 are protected from being etched in recessing process 118 (FIG. 17, 22, or 31), and will have a top surface higher than the recessed portions of dielectric layer 64 by height difference D1 also.

Alternatively, electrical connector 114" represents a possible electrical connector large enough to extend on UBM ring anchor 74B. Accordingly, the entire portion of dielectric layer 64 between UBM pad 74A and UBM ring anchor 74B is protected from being etched in recessing process 118, and will have a top surface higher than the recessed portion of dielectric layer 64 by height difference D1. Electrical connector 114''' represents another possible electrical connector extending beyond UBM ring anchor 74B. Similarly, portions 64" and 64' of dielectric layer 64 will not be recessed in recessing process 118, and will have a top surface higher than the recessed portions of dielectric layer 64 by height difference D1.

Figure 34:
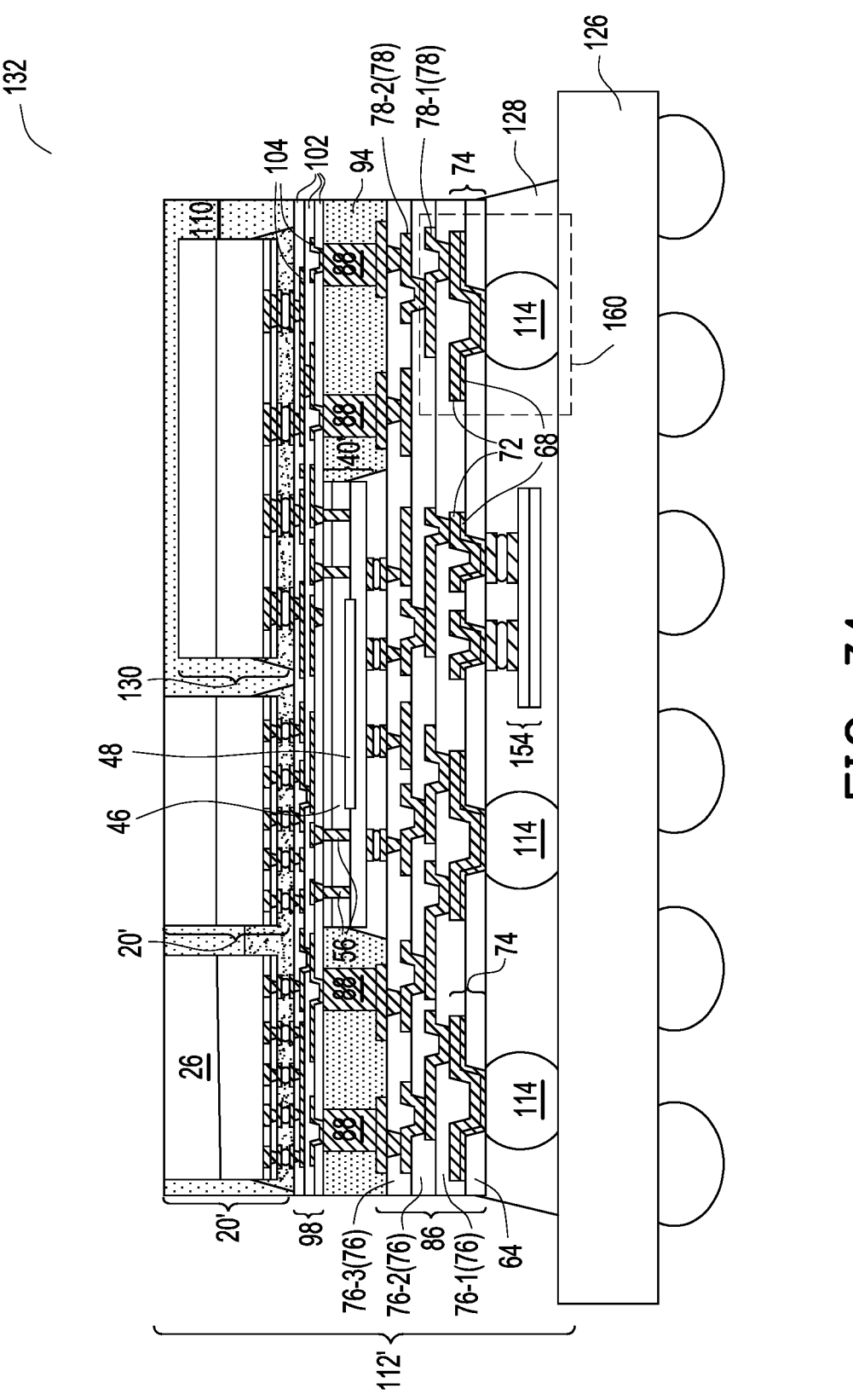

It is also appreciated that the UBM 74 in FIGS. 19, 25, and 34 are upside down than shown in FIGS. 35 and 38. When recessing process 118 is performed, in FIGS. 19, 25, and 34, the bottom surface of dielectric layer 64 will be recessed in an upward direction, and will be higher, than the bottom surface of UBM pad 74A.

Figure 39:
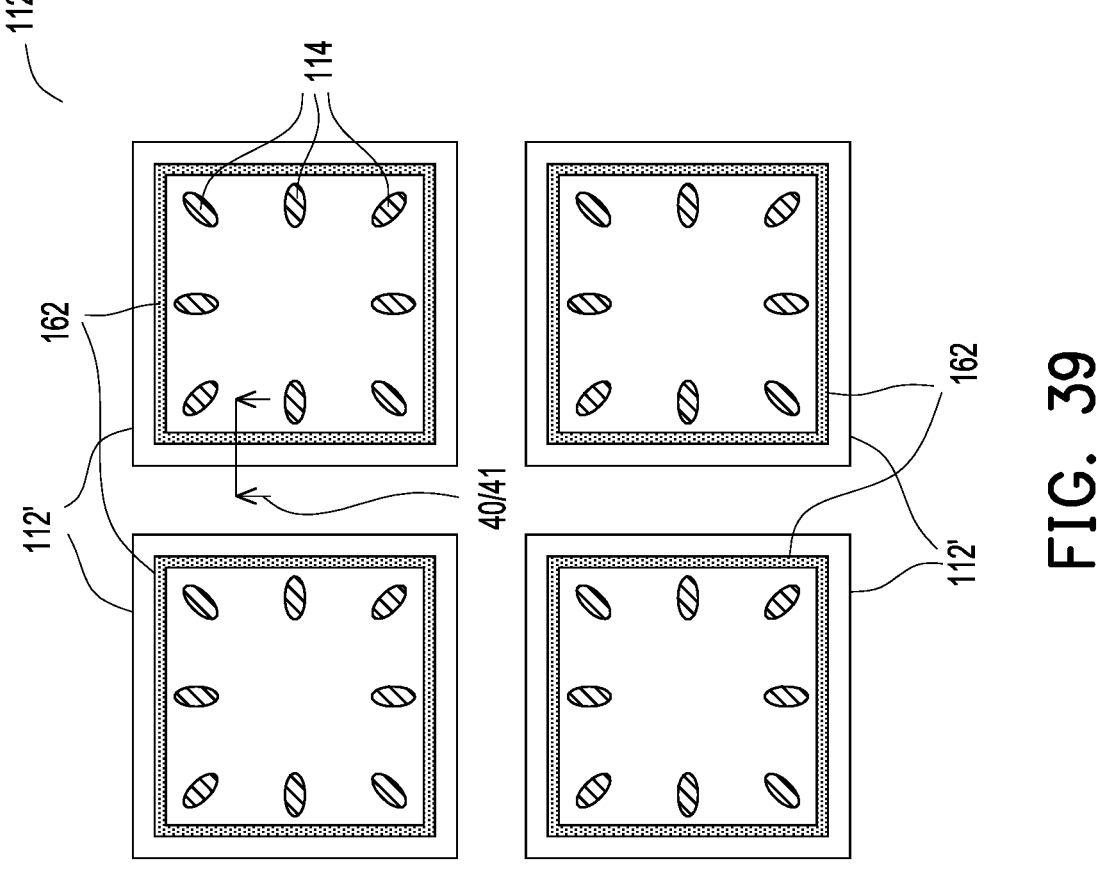
FIG. 39 illustrates the top view of seal rings in accordance with some embodiments.
Figures 40, 41:
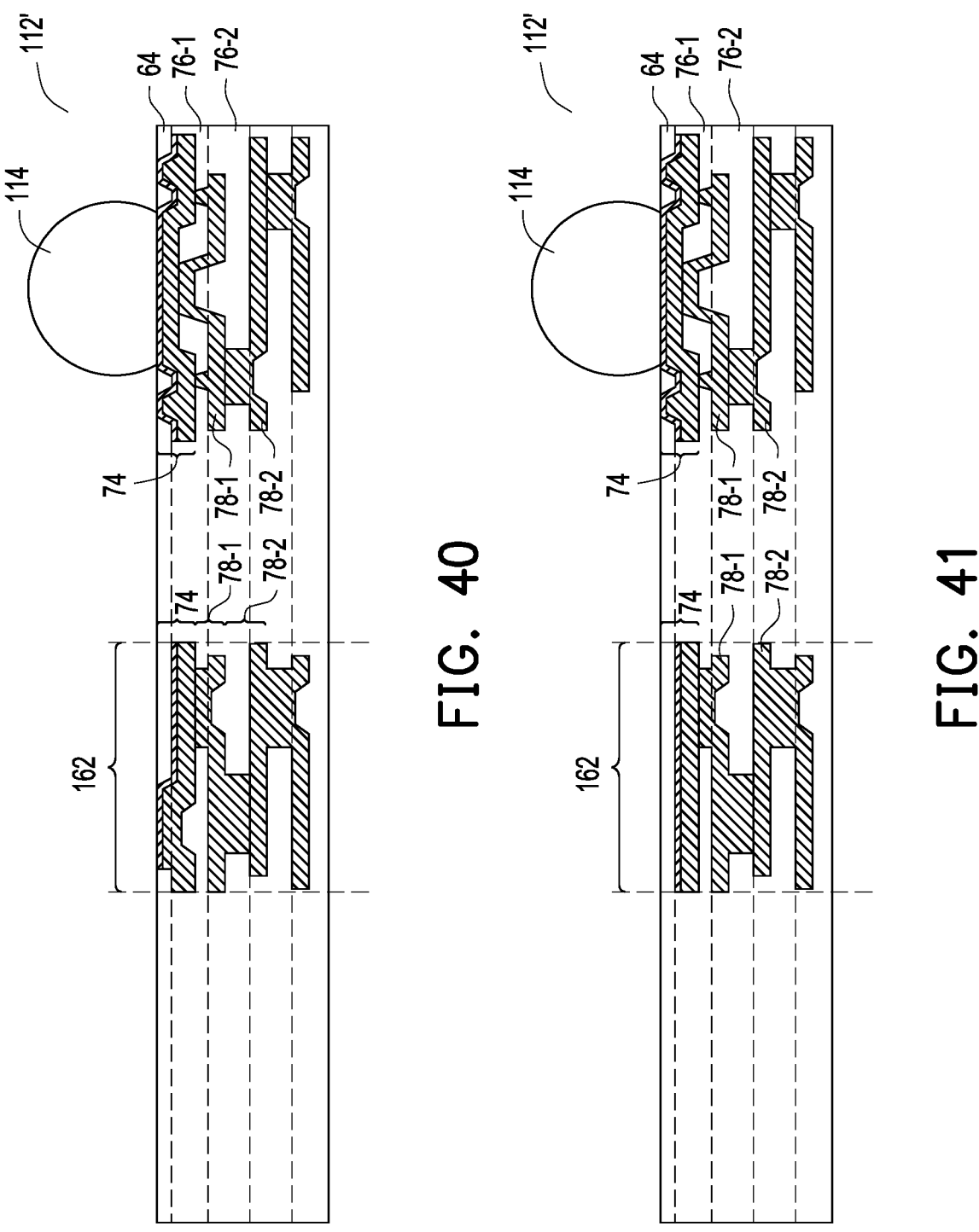
FIGS. 40 and 41 illustrate the cross-sectional views of seal rings in accordance with some embodiments.

FIG. 39 illustrates a portion of reconstructed wafer 112 (FIG. 18, 24, or 33), which includes a plurality of packages 112' therein. Each of packages 112' may include a seal ring 162 formed in the peripheral regions of the corresponding package 112'. FIGS. 40 and 41 illustrate the cross-sectional views of seal rings 162 in accordance with some embodiments. The cross-sections shown in FIGS. 40 and 41 may be obtained in cross-section 40/41—40/41 as shown in FIG. 39. In each of FIGS. 40 and 41, seal ring 162 also includes a top portion at the same level as UBM 74. In FIG. 40, the top portion of seal ring 162 extends into dielectric layer 64. Accordingly, the top portion of seal ring 162 has a hat shape. In FIG. 41, the top portion is fully imbedded between dielectric layers 64 and 76-1, and seal ring 162 does not extend into dielectric layer 64.

The embodiments of the present disclosure have some advantageous features. By adopting the UBM-first approach and using face-to-back bonding scheme to form a package, a single carrier may be adopted in accordance with some embodiments. The manufacturing cost is thus reduced. The UBM has a special shape that includes an anchor ring for improving mechanical strength and reducing delamination. A recessing process may be performed to recess the dielectric layer in which UBM is embedded. Accordingly, the likelihood of the delamination propagation of the dielectric layer from UBM is reduced.

In accordance with some embodiments, a method comprises forming a reconstructed wafer comprising forming an UBM over a first carrier; forming a first interconnect structure comprising a plurality of redistribution lines over and electrically connecting to the UBM; bonding a first die over the first interconnect structure; encapsulating the first die in a first encapsulant; forming a second interconnect structure over the first die; and bonding a second die over the second interconnect structure; de-bonding the reconstructed wafer from the first carrier; forming an electrical connector physically contacting the UBM; sawing the reconstructed wafer to form a plurality of packages; and bonding one of the plurality of packages to a package component.

In an embodiment, the method further comprises forming a dielectric layer over the first carrier, wherein the UBM extends into the dielectric layer. In an embodiment, the method further comprises, after the de-bonding the reconstructed wafer, recessing the dielectric layer. In an embodiment, the UBM comprises an UBM pad in the dielectric layer; an UBM ring anchor encircling the UBM pad, wherein the UBM ring anchor is in the dielectric layer; and a connecting portion outside of and contacting the dielectric layer, wherein the connecting portion is physically joined to both of the UBM pad and the UBM ring anchor. In an embodiment, the electrical connector comprises a solder region, and wherein the solder region physically contacts the UBM.

In an embodiment, no more carrier is used in an entire period of time after the reconstructed wafer is de-bonded and before the one of the plurality of packages is bonded to the package component. In an embodiment, the method further comprises, before the de-bonding the reconstructed wafer from the first carrier, attaching the reconstructed wafer to a second carrier, wherein the forming the electrical connector is performed over the second carrier, and wherein the forming the electrical connector comprises plating a metal pillar. In an embodiment, the second die and the first die are bonded in a face-to-back scheme.

In an embodiment, the method further comprises bonding a memory stack to the package component, wherein the memory stack is separated from the one of the plurality of packages. In an embodiment, the method further comprises bonding a memory stack to the second interconnect structure, wherein the memory stack is inside the one of the plurality of packages. In an embodiment, the method further comprises, bonding an additional die to the one of the plurality of packages, wherein the additional die is between the package component and the one of the plurality of packages. In an embodiment, the first die comprises a semiconductor substrate, and through-vias extending into the semiconductor substrate, and wherein the method further comprises, after the first die is encapsulated in the first encapsulant and before the second interconnect structure is formed, polishing the semiconductor substrate to reveal the through-vias.

In accordance with some embodiments, a package comprises a first interconnect structure comprising a dielectric layer; an UBM comprising an UBM pad in the dielectric layer; and a connecting portion over and contacting the dielectric layer; and an electrical connector underlying and physically contacting the UBM; a first die over and bonding to the first interconnect structure; an encapsulant encapsulating the first die therein; a second interconnect structure over and connected to the first die; and a second die over and connected to the second interconnect structure.

In an embodiment, the UBM further comprises an UBM ring anchor encircling the UBM pad and in the dielectric layer, wherein the connecting portion is physically joined to both of the UBM pad and the UBM ring anchor. In an embodiment, the UBM pad, the UBM ring anchor, and the connecting portion collectively form a basin, wherein a portion of the dielectric layer is in the basin. In an embodiment, the electrical connector comprises a solder region, and wherein the solder region physically contacts the UBM pad. In an embodiment, the dielectric layer comprises a first bottom surface, and the UBM pad comprises a second bottom surface lower than the first bottom surface.

In accordance with some embodiments, a package comprises an interconnect structure comprising a first dielectric layer; a second dielectric layer over and contacting the first dielectric layer; an UBM comprising an UBM pad in the first dielectric layer; an UBM ring anchor encircling the UBM pad and in the first dielectric layer; and an embedded portion in the second dielectric layer, wherein the embedded portion interconnects the UBM pad and the UBM ring anchor; an electrical connector underlying and contacting the UBM pad; and a package component bonded to the interconnect structure through the electrical connector. In an embodiment, the first dielectric layer comprises a first bottom surface, and the UBM pad comprises a second bottom surface lower than the first bottom surface. In an embodiment, the first dielectric layer comprises a first bottom surface, and the UBM pad comprises a second bottom surface level with the first bottom surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a reconstructed wafer comprising:
forming an Under-Bump Metallurgy (UBM) over a first carrier, wherein the UBM comprises:
an UBM pad in a dielectric layer;
an UBM ring anchor encircling the UBM pad, wherein the UBM ring anchor is in the dielectric layer; and
a connecting portion outside of and contacting the dielectric layer, wherein the connecting portion is physically joined to both of the UBM pad and the UBM ring anchor;

forming a first interconnect structure comprising a plurality of redistribution lines over and electrically connecting to the UBM;
bonding a first die over the first interconnect structure;
encapsulating the first die in a first encapsulant;
forming a second interconnect structure over the first die; and
bonding a second die over the second interconnect structure;
de-bonding the first carrier;
forming an electrical connector comprising solder, wherein the solder is in contact with the UBM pad, and is physically spaced apart from the UBM ring anchor; and
separating the reconstructed wafer to form a plurality of packages.

2. The method of claim 1 further comprising forming a dielectric layer over the first carrier, wherein the UBM extends into the dielectric layer.

3. The method of claim 2, wherein the method further comprises, after the de-bonding the reconstructed wafer, recessing the dielectric layer.

4. The method of claim 1, wherein the electrical connector comprises a solder region, and wherein the solder region physically contacts the UBM.

5. The method of claim 1 further comprising bonding one of the plurality of packages to a package component, wherein no more carrier is used in an entire period of time after the reconstructed wafer is de-bonded and before the one of the plurality of packages is bonded to the package component.

6. The method of claim 5 further comprising bonding a memory stack to the package component, wherein the memory stack is separated from the one of the plurality of packages.

7. The method of claim 5 further comprising, bonding an additional die to the one of the plurality of packages, wherein the additional die is between the package component and the one of the plurality of packages.

8. The method of claim 1 further comprising:
before the de-bonding the reconstructed wafer from the first carrier, attaching the reconstructed wafer to a second carrier, wherein the forming the electrical connector is performed over the second carrier, and wherein the forming the electrical connector comprises plating a metal pillar.

9. The method of claim 1, wherein the second die and the first die are bonded in a face-to-back scheme.

10. The method of claim 1 further comprising bonding a memory stack to the second interconnect structure, wherein the memory stack is inside the one of the plurality of packages.

11. The method of claim 1, wherein the first die comprises a semiconductor substrate, and through-vias extending into the semiconductor substrate, and wherein the method further comprises:
after the first die is encapsulated in the first encapsulant and before the second interconnect structure is formed, polishing the semiconductor substrate to reveal the through-vias.

12. A method comprising:
forming a first interconnect structure comprising:
a dielectric layer;
an Under-Bump Metallurgy (UBM) comprising:
an UBM pad in the dielectric layer;
a connecting portion contacting the dielectric layer; and an UBM ring anchor encircling the UBM pad and in the dielectric layer, wherein the connecting portion is physically joined to both of the UBM pad and the UBM ring anchor, wherein the UBM pad, the UBM ring anchor, and the connecting portion collectively form a basin, with an in-basin portion of the dielectric layer being in the basin; and an electrical connector underlying and physically contacting the UBM, wherein the in-basin portion is underlying the connecting portion and higher than the electrical connector;

forming a first die;

bonding the first die to the first interconnect structure;

encapsulating the first die in an encapsulant;

forming a second interconnect structure;

electrically connecting the second interconnect structure to the first die; and connecting a second die over the second interconnect structure.

13. The method of claim 12, wherein the electrical connector comprises a solder region, and wherein the solder region physically contacts the UBM pad.

14. The method of claim 12, wherein the dielectric layer comprises a first bottom surface, and the UBM pad comprises a second bottom surface lower than the first bottom surface.

15. A method comprising:

forming an interconnect structure comprising:

a first dielectric layer;

a second dielectric layer over and contacting the first dielectric layer;

a Under-Bump Metallurgy (UBM) comprising:

an UBM pad in the first dielectric layer;

an UBM ring anchor encircling the UBM pad and in the first dielectric layer; and an interconnect portion in the second dielectric layer, wherein the interconnect portion interconnects the UBM pad and the UBM ring anchor, wherein the first dielectric layer comprises an in-basin portion in a basin formed by the UBM pad, the UBM ring anchor and the interconnect portion;

forming an electrical connector underlying and contacting the UBM pad, wherein the electrical connector is in contact with the in-basin portion; and bonding a package component to the interconnect structure through the electrical connector.

16. The method of claim 15, wherein the first dielectric layer comprises a first bottom surface, and the UBM pad comprises a second bottom surface lower than the first bottom surface.

17. The method of claim 15, wherein the first dielectric layer comprises a first bottom surface, and the UBM pad comprises a second bottom surface level with the first bottom surface.

18. The method of claim 12, wherein the electrical connector is in physical contact with the in-basin portion of the dielectric layer.

19. The method of claim 18, wherein the electrical connector is in physical spaced apart from the UBM ring anchor.

20. The method of claim 18, wherein the electrical connector is further in physical contact with the UBM ring anchor.

* * * * *